(12) United States Patent
Wang

(10) Patent No.: US 8,962,347 B2
(45) Date of Patent: Feb. 24, 2015

(54) SEMICONDUCTOR DEVICE AND METHOD OF MANUFACTURING THE SAME

(75) Inventor: Wensheng Wang, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/301,396

(22) Filed: Nov. 21, 2011

(65) Prior Publication Data
US 2012/0181659 A1 Jul. 19, 2012

(30) Foreign Application Priority Data
Jan. 19, 2011 (JP) .................................. 2011-009063

(51) Int. Cl.
*H01L 21/00* (2006.01)
*H01L 27/115* (2006.01)
*H01L 49/02* (2006.01)

(52) U.S. Cl.
CPC .......... *H01L 27/11507* (2013.01); *H01L 28/56* (2013.01)
USPC .............................. 438/3; 438/381; 438/393

(58) Field of Classification Search
None
See application file for complete search history.

(56) References Cited

U.S. PATENT DOCUMENTS

| | | | |
|---|---|---|---|
| 7,473,949 B2 | 1/2009 | Cross et al. | |
| 7,592,657 B2 * | 9/2009 | Wang | 257/295 |
| 8,093,071 B2 | 1/2012 | Wang | |
| 8,344,434 B2 | 1/2013 | Wang et al. | |
| 8,349,679 B2 | 1/2013 | Wang | |
| 2005/0161717 A1 | 7/2005 | Nakamura et al. | |
| 2007/0090461 A1 * | 4/2007 | Eliason et al. | 257/363 |
| 2008/0061331 A1 | 3/2008 | Wang et al. | |
| 2008/0073680 A1 * | 3/2008 | Wang | 257/295 |
| 2008/0111172 A1 * | 5/2008 | Wang et al. | 257/295 |
| 2008/0160645 A1 | 7/2008 | Nakamura et al. | |

FOREIGN PATENT DOCUMENTS

| | | | | |
|---|---|---|---|---|
| JP | 2003218325 A | * | 7/2003 | ............ H01L 27/105 |
| JP | 2006-318941 | | 11/2006 | |
| JP | 2008-10772 A | | 1/2008 | |
| JP | 2008-071825 A | | 3/2008 | |
| JP | 2008-124331 A | | 5/2008 | |
| WO | WO-2004-053991 | | 6/2004 | |

OTHER PUBLICATIONS

Japanese Office Action mailed Jun. 10, 2014 for corresponding Japanese Application No. 2011-009063, with Partial English Translation, 9 pages.

* cited by examiner

*Primary Examiner* — Whitney T Moore
*Assistant Examiner* — Joseph Galvin, III
(74) *Attorney, Agent, or Firm* — Fujitsu Patent Center

(57) ABSTRACT

A ferroelectric capacitor formed above a semiconductor substrate includes a lower electrode, a dielectric film (ferroelectric film) having ferroelectric characteristics, and an upper electrode. The upper electrode includes a conductive oxide film made of a ferroelectric material to which conductivity is provided by adding a conductive material such as Ir, and the conductive oxide film is in contact with the dielectric film.

12 Claims, 27 Drawing Sheets

SEMICONDUCTOR DEVICE AND METHOD OF MANUFACTURING THE SAME

CROSS-REFERENCE TO RELATED APPLICATION

This application is based upon and claims and the benefit of priority of the prior Japanese Patent Application No. 2011-009063, filed on Jan. 19, 2011, the entire contents of which are incorporated herein by reference.

FIELD

The embodiments discussed herein relate to a semiconductor device including a ferroelectric capacitor, and a method of manufacturing the semiconductor device.

BACKGROUND

With the recent developments in digital technologies, size reduction, performance enhancement, and multifunctionalization of various electronic devices have been advanced. Many of these electronic devices use semiconductor devices (LSI: Large Scale Integration) having built-in storage elements. The storage elements include volatile memory which loses data when power supply stops, and non-volatile memory which can retain data without power supply.

The volatile memory includes DRAM (Dynamic Random-Access Memory), SRAM (Static Random Access Memory), and the like, and has an advantage of allowing high-speed data access. Meanwhile, the non-volatile memory includes EEPROM (Electrically Erasable Programmable Read Only Memory), flash memory, FeRAM (Ferroelectric Random Access Memory), and the like. The above-described semiconductor devices are provided with either or both of the volatile memory and the non-volatile memory, depending on the purposes of use of the semiconductor devices.

FeRAM, which is a kind of non-volatile memory, has advantages of allowing fast-speed data access, consuming low power, and allowing high-frequency rewriting. FeRAM uses ferroelectric capacitors to store data. The ferroelectric capacitors each have a structure in which a film made of a ferroelectric material having a ferroelectric characteristic (spontaneous polarization), such as PZT ($PbZr_xTi_{1-x}O_3$, provided that $0<x<1$), is sandwiched between a pair of electrodes.

[Patent Document 1] International Patent Pamphlet No. WO 2004053991
[Patent Document 2] Japanese Laid-open Patent Publication No. 2008-071825
[Patent Document 3] Japanese Laid-open Patent Publication No. 2006-318941

Semiconductor devices are preferably more miniaturized and more power-saving. To meet these demands, FeRAM preferably has a ferroelectric film having a reduced film thickness.

SUMMARY

One aspect of a technology disclosed herein provides a semiconductor device including: a semiconductor substrate; a capacitor formed above the semiconductor substrate, and having a lower electrode, a ferroelectric film, and an upper electrode; and a conductive oxide film provided between the ferroelectric film and the upper electrode, and having the same structure as a structure of the ferroelectric film, and containing a ferroelectric material provided with conductivity.

Meanwhile, another aspect of the technology disclosed herein provides a method of manufacturing a semiconductor device, the method comprising: forming a lower electrode film above a semiconductor substrate; forming a dielectric film made of a ferroelectric material on the lower electrode film; subjecting the dielectric film to a crystallization treatment; and forming a conductive oxide film on the dielectric film, the conductive oxide film being made of a ferroelectric material to which conductivity is provided by adding a conductive material.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, prelude for facilitating the understanding of embodiments will be described prior to the description of the embodiments.

Figure 1A:
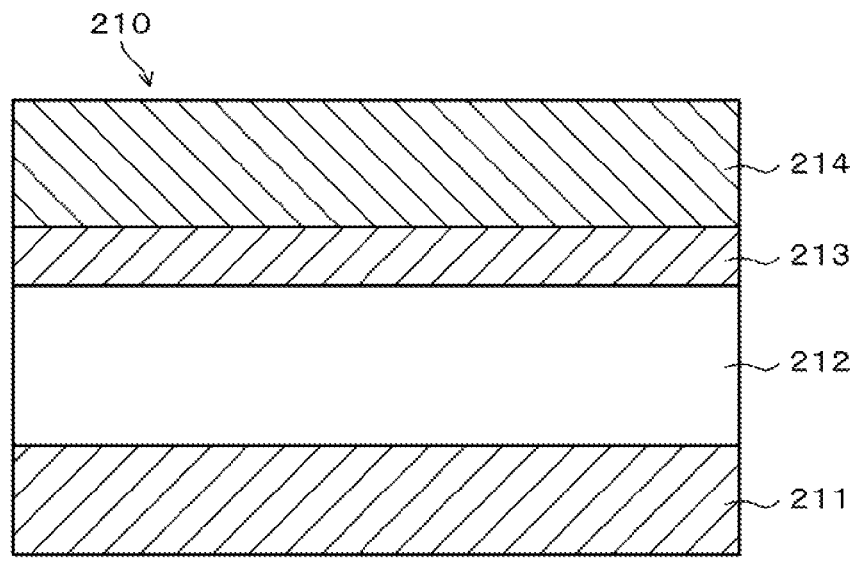
FIG. 1A is a cross-sectional view illustrating an example of a ferroelectric capacitor.
Figure 1B:
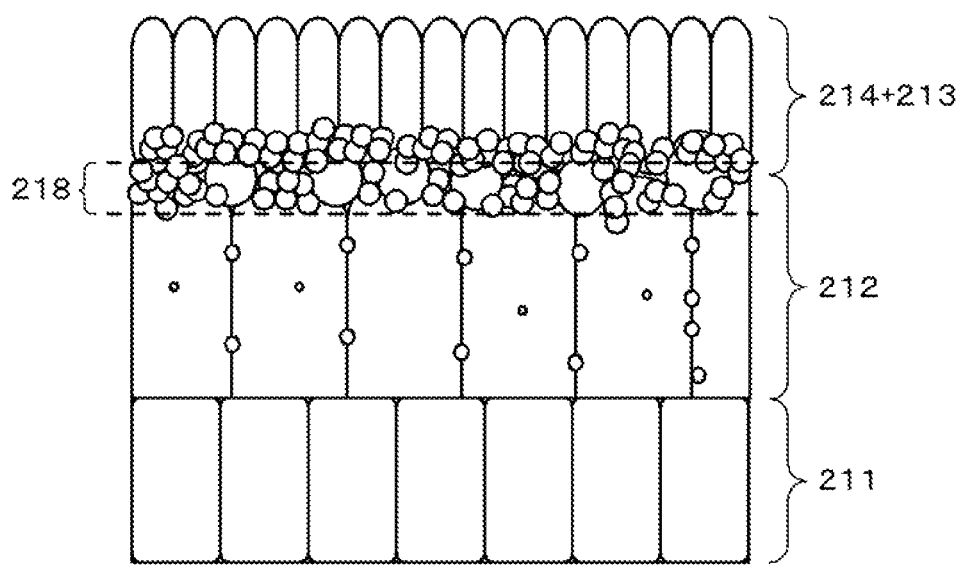
FIG. 1B is a diagram schematically illustrating a structure of layers of the same ferroelectric capacitor.

FIG. 1A is a cross-sectional view illustrating an example of a ferroelectric capacitor, and FIG. 1B is a diagram schematically illustrating a structure of layers of the same ferroelectric capacitor.

The ferroelectric capacitor 210 illustrated in FIGS. 1A and 1B has a structure in which a lower electrode film 211, a dielectric film 212, a first upper electrode film 213, and a second upper electrode film 214 are stacked in this order from the bottom. The lower electrode film 211 is formed of Pt (platinum). The dielectric film 212 is formed of PZT. The first upper electrode film 213 is formed of IrOx (iridium oxide: provided that 0<x). The second upper electrode film 214 is formed of $IrO_2$ (iridium oxide). As illustrated in FIG. 1B, the dielectric film 212 has a columnar crystal structure, and each of the lower electrode film 211 and the upper electrode films 213 and 214 has a crystallized structure.

The electrode films 213 and 214 are formed on the dielectric film 212 by a sputtering method or the like. At this time, the dielectric film 212 is damaged, and the ferroelectric characteristics thereof deteriorate. Moreover, also when the electrode films 211, 213, and 214 and the dielectric film 212 are patterned, the dielectric film 212 is damaged. For this reason, after a film formation process for forming the electrode films 213 and 214, or a patterning process, a heat treatment (annealing) is performed in an oxygen atmosphere to thereby recover the damage on the dielectric film 212, in general.

However, interdiffusion occurs between Ir (iridium) in the electrode films 213 and 214 and Pb (lead) in the dielectric film 212 during the heat treatment. As a result, a paraelectric layer (dead layer) 218 is formed at an interface between the dielectric film 212 and the electrode film 213. Since a voltage applied to the dielectric film 212 is reduced by an amount corresponding to the paraelectric layer 218, the operating voltage of the ferroelectric capacitor 210 is increased.

In general, characteristics of a ferroelectric capacitor are evaluated on the basis of the relationship between the switching charge Qsw and the applied voltage V (hereinafter referred to as Qtv characteristics). However, the Qtv characteristics are influenced by the leak current of the capacitor. For evaluation of the true capacitor characteristics which are not influenced by the leak current, it is preferably to determine the saturation charge Qt and the coercive electric field (or coercive voltage) of the capacitor from the Qtv characteristics by use of a mathematical model.

The saturation charge Qt represents not simply the magnitude of the switching charge Qsw, but represents a charge which actually contributes to the polarization switching. For this reason, the saturation charge Qt is an important parameter in developing a material for a ferroelectric capacitor driven at a low voltage.

Figure 2:
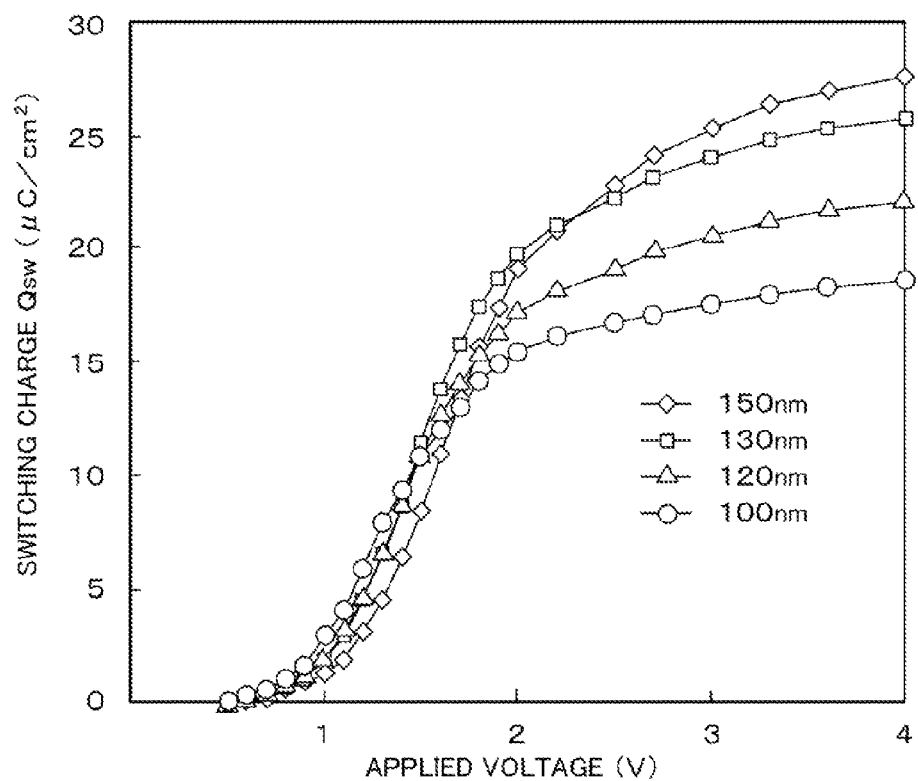
FIG. 2 is a graph illustrating the relationship between the switching charge Qsw and the applied voltage V of dielectric films having various film thicknesses in ferroelectric capacitors having the structure of FIGS. 1A and 1B.
Figure 3:
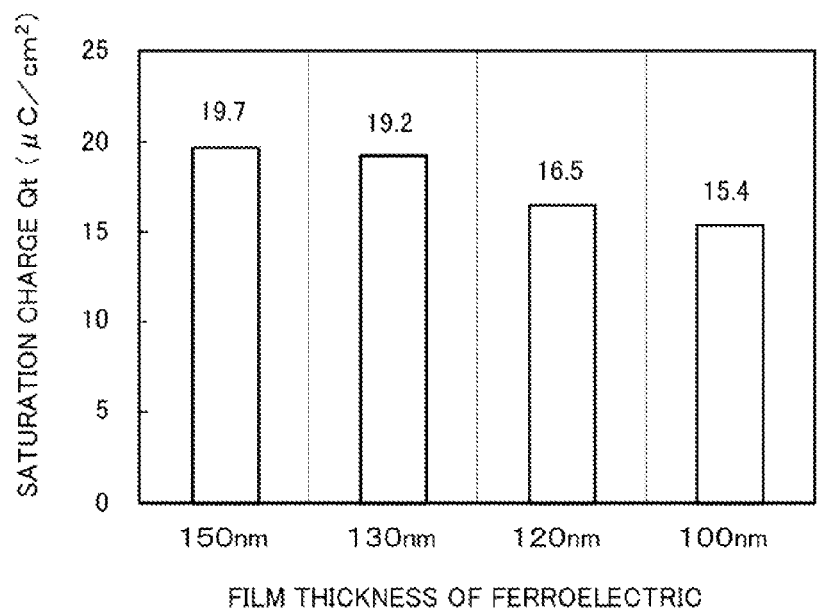
FIG. 3 is a diagram illustrating an example of the relationship between the film thickness and the saturation charge Qt of the dielectric films in the ferroelectric capacitors having the structure of FIGS. 1A and 1B.
Figure 4:
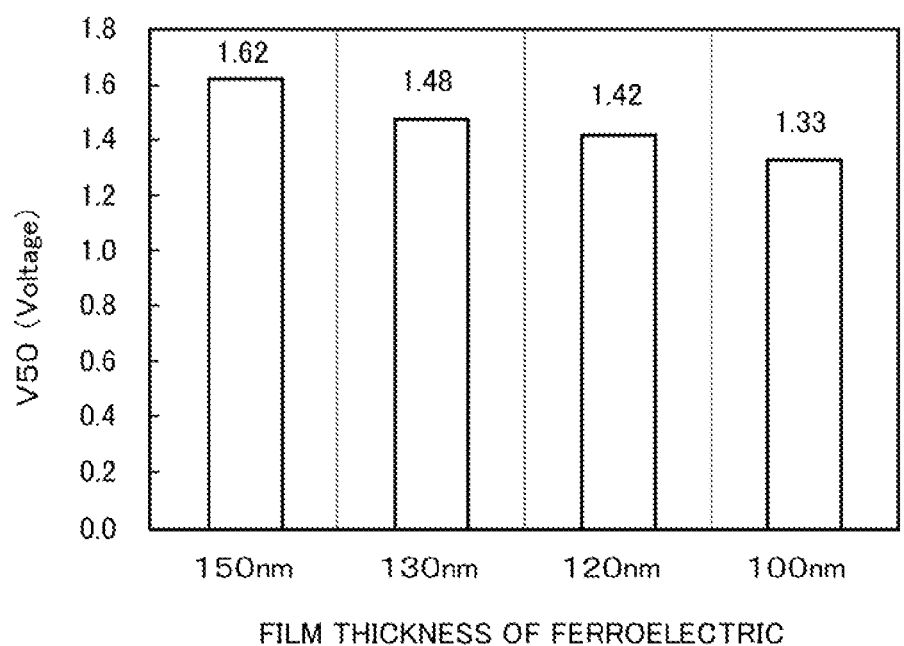
FIG. 4 is a diagram illustrating an example of the relationship between the film thickness and the V50 of the dielectric films in the ferroelectric capacitors having the structure of FIGS. 1A and 1B.

FIG. 2 is a graph illustrating an example of the relationship between the switching charge Qsw and the applied voltage V in the cases where the film thicknesses of the dielectric film 212 are 100 nm, 120 nm, 130 nm, and 150 nm, respectively. In FIG. 2, the horizontal axis represents the applied voltage, and the vertical axis represents the switching charge Qsw. FIG. 3 is a diagram illustrating an example of the relationship between the film thickness of the dielectric film 212 and the saturation charge Qt. FIG. 4 is a diagram illustrating an example of the relationship between the film thickness of the dielectric film 212 and the V50. Note that the V50 is a voltage at which 50% of the domains in the dielectric film 212 are polarized and rearranged by an applied electric field in the direction of the electric field. The value of V50 has a relationship with the coercive voltage Vc, and it may be said that a smaller value of V50 allows operation at a lower voltage.

As seen from FIGS. 2 and 4, as the film thickness of the dielectric film 212 becomes thinner, the curve (Qtv characteristics) representing the relationship between the switching charge Qsw and the applied voltage V rises at an earlier stage, and the V50 also becomes lower, in the case of the ferroelectric capacitor 210 of FIGS. 1A and 1B. However, the degree of the reduction in V50 is small relative to the decrease in the film thickness.

Moreover, as seen from FIG. 3, as the film thickness of the dielectric film 212 becomes thinner, the saturation charge Qt becomes lower. This means that when the film thickness of the dielectric film 212 is reduced to meet the demands for higher integration and lower driving voltage of a semiconductor device, the characteristics of the ferroelectric capacitor 210 change. In the ferroelectric capacitor 210 of this structure, the dielectric film 212 preferably has a film thickness of 130 nm or more. If the film thickness is less than 130 nm, the saturation charge Qt becomes so small that it becomes difficult to obtain desired characteristics.

Figure 5A:
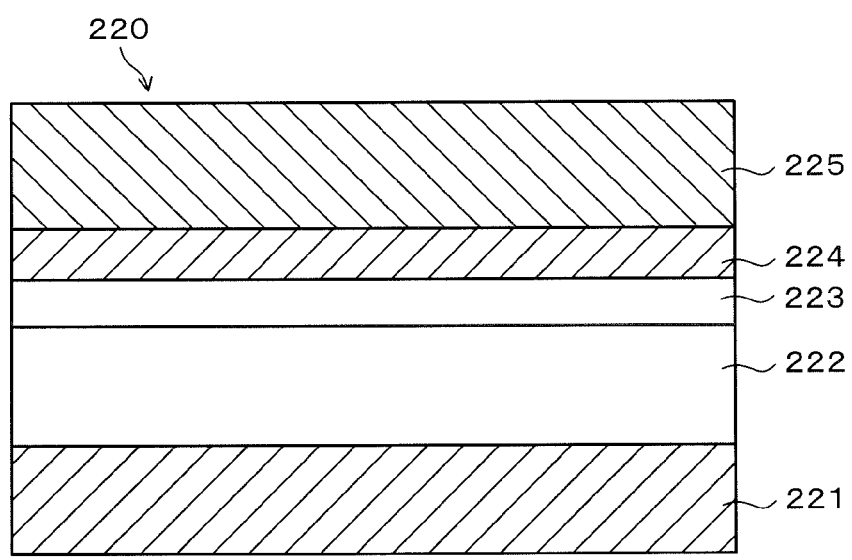
FIG. 5A is a cross-sectional view illustrating another example of a ferroelectric capacitor.
Figure 5B:
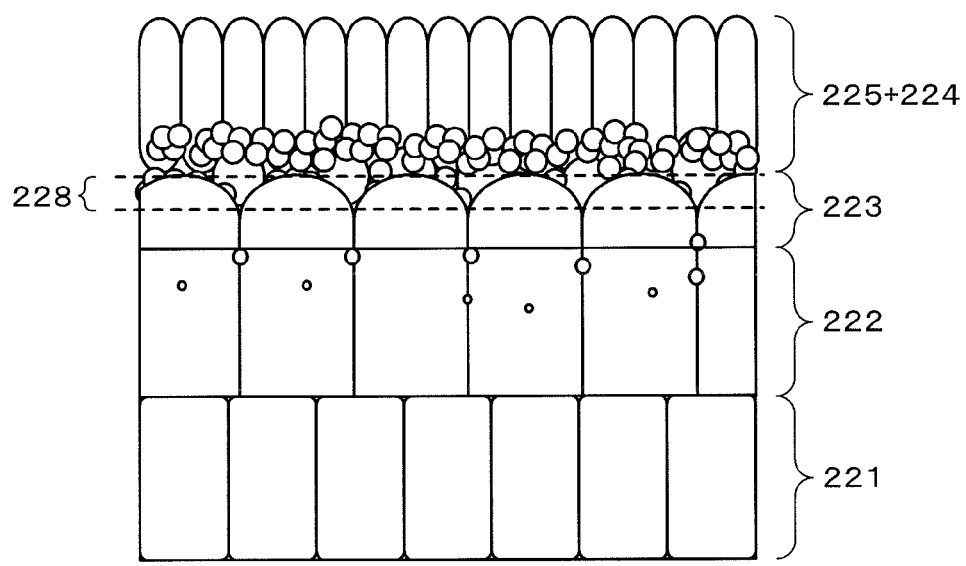
FIG. 5B is a diagram schematically illustrating the structure of layers in the same ferroelectric capacitor.

FIG. 5A is a cross-sectional view illustrating another example of the ferroelectric capacitor. FIG. 5B is a diagram schematically illustrating the structure of layers of the same ferroelectric capacitor.

The ferroelectric capacitor 220 illustrated in FIGS. 5A and 5B has a structure in which a lower electrode film 221, a first dielectric film 222, a second dielectric film 223, a first upper electrode film 224, and a second upper electrode film 225 are stacked in this order from the bottom. The lower electrode film 221 is formed of Pt. The first dielectric film 222 and the second dielectric film 223 are formed of PZT. The first upper electrode film 224 is formed of IrOx. The second upper electrode film 225 is formed of $IrO_2$. Note that the reference numeral 228 in FIG. 5B represents a paraelectric layer formed because of interdiffusion of Ir and Pb between the dielectric films 222 and 223 and the electrode films 224 and 225.

Figure 6:
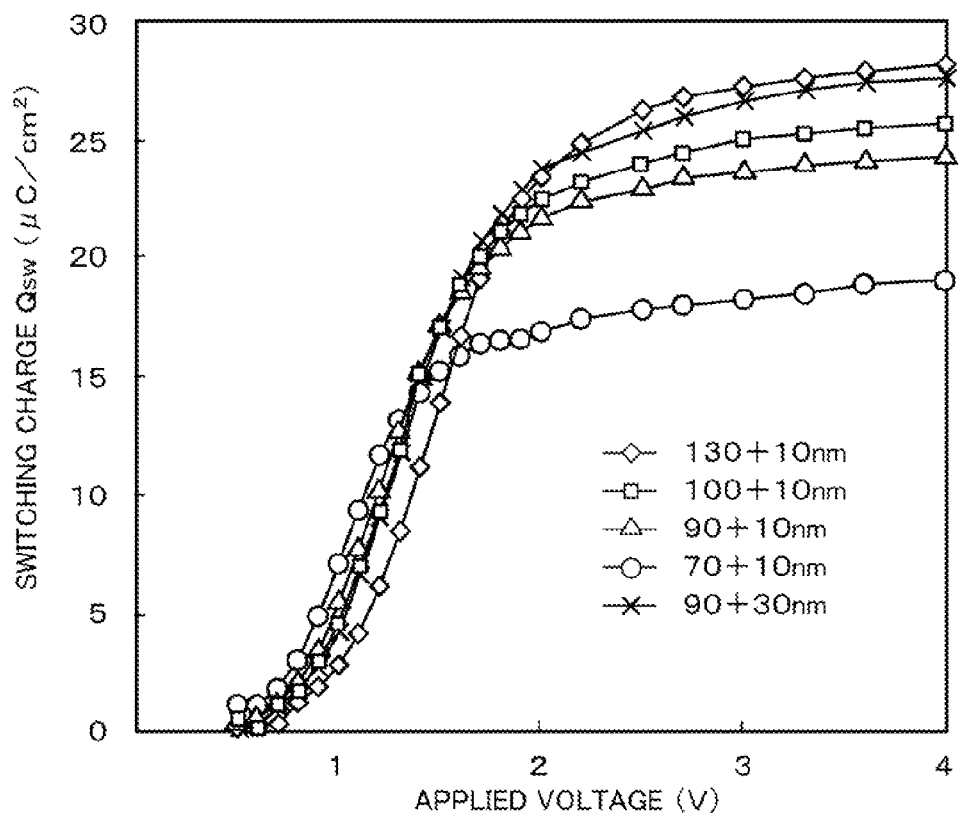
FIG. 6 is a graph illustrating the relationship between the switching charge Qsw and the applied voltage V of dielectric films having various film thicknesses in ferroelectric capacitors having the structure of FIGS. 5A and 5B.
Figure 7:
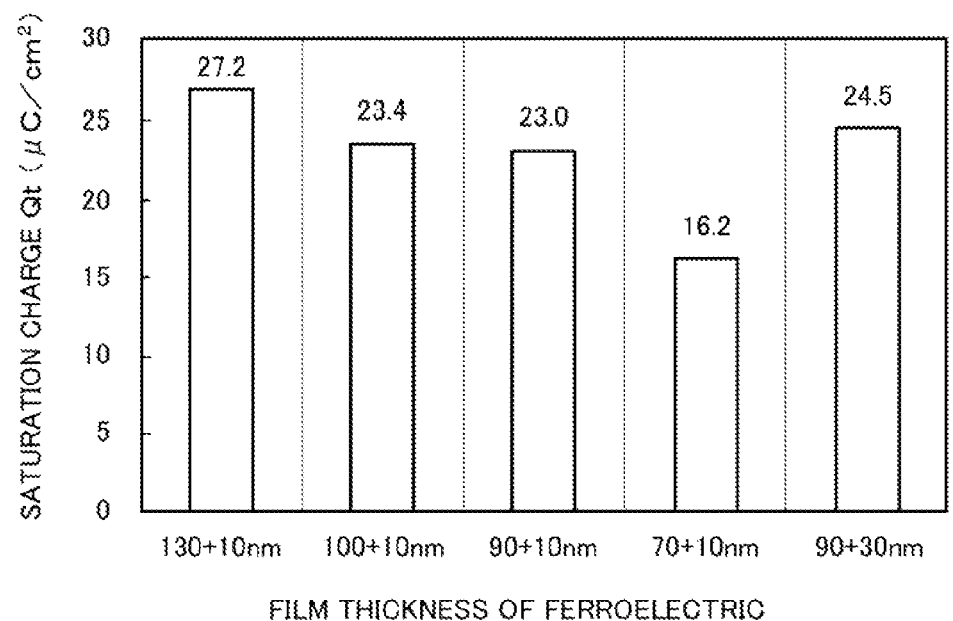
FIG. 7 is a diagram illustrating an example of the relationship between the film thickness and the saturation charge Qt of the dielectric films in the ferroelectric capacitors having the structure of FIGS. 5A and 5B.
Figure 8:
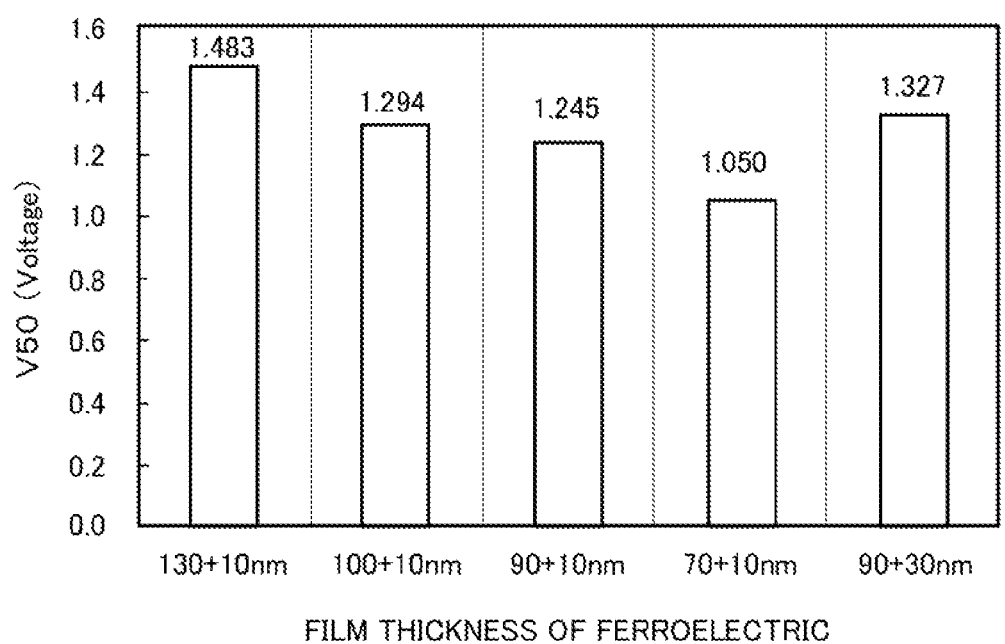
FIG. 8 is a diagram illustrating an example of the relationship between the film thickness and the V50 of the dielectric films in the ferroelectric capacitors having the structure of FIGS. 5A and 5B.

FIG. 6 is a graph illustrating an example of the relationship between the switching charge Qsw and the applied voltage V. In the FIG. 6, the horizontal axis represents the applied voltage, and the vertical axis represents the switching charge Qsw. Meanwhile, FIG. 7 is a diagram illustrating an example of the relationship between the film thickness of the dielectric film (the total film thickness of the dielectric film 222 and the dielectric film 223) and the saturation charge Qt. FIG. 8 is diagram illustrating an example of the relationship between the film thickness of the dielectric film (the total film thickness of the dielectric film 222 and the dielectric film 223) and the V50.

As seen from FIGS. 6 and 8, as the film thickness of the ferroelectric capacitor 220 of FIGS. 5A and 5B becomes thinner, the curve (Qtv characteristics) representing the relationship between the switching charge Qsw and the applied voltage V rises at an earlier stage, and the V50 also becomes lower. As seen from FIG. 7, as the film thickness of the dielectric film (the total film thickness of the first dielectric film 222 and the second dielectric film 223) becomes thinner, the saturation charge Qt becomes lower, in the case of the ferroelectric capacitor 220 having the structure illustrated in FIGS. 5A and 5B.

The ferroelectric capacitor 220 in FIGS. 5A and 5B has a smaller leak current and a thinner layer thickness of the paraelectric layer than the ferroelectric capacitor 210 in FIGS. 1A and 1B. However, also in the case of the ferroelectric capacitor 220, the film thickness of the dielectric film (the total film thickness of the first dielectric film 222 and the second dielectric film 223) is preferably 100 nm or more. If the film thickness is thinner than 100 nm, the saturation charge Qt becomes so low that it becomes difficult to obtain desired characteristics.

Hereinafter, embodiments will be described.

First Embodiment

Figure 9:
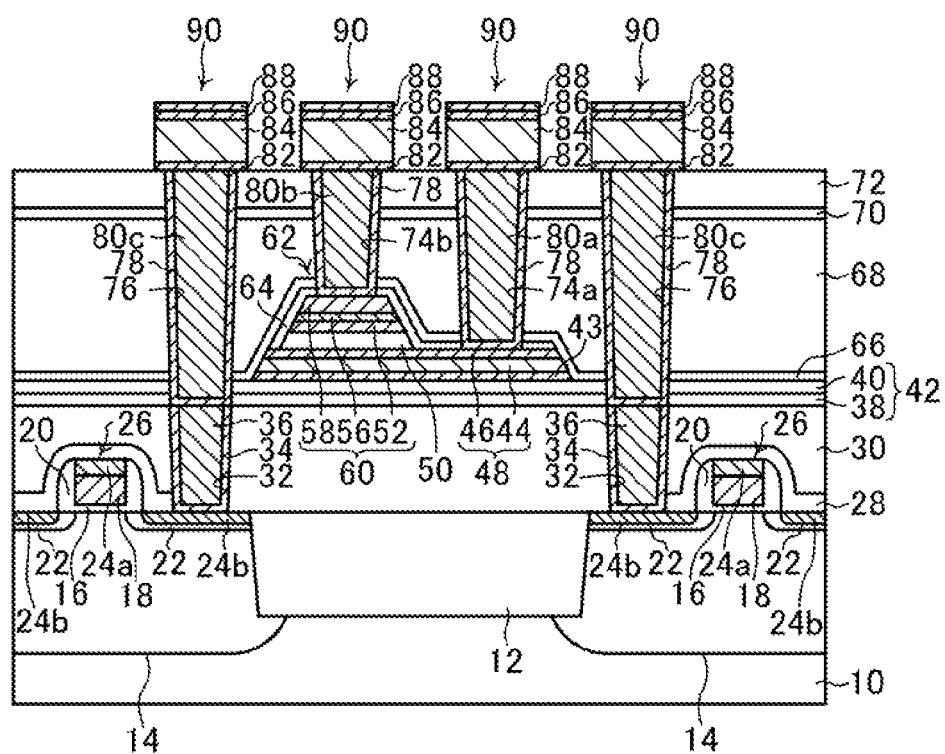
FIG. 9 is a cross-sectional view illustrating the structure of a semiconductor device according to a first embodiment.

FIG. 9 is a cross-sectional view illustrating a structure of a semiconductor device according to a first embodiment. In the description of the first embodiment, a planar-type FeRAM is taken as an example.

An element isolation film 12 is formed in a predetermined region of a semiconductor substrate (a silicon substrate) 10. Moreover, wells 14 are formed in element formation regions defined by the element isolation film 12.

A pair of source and drain regions 22 separated from each other are formed in each well 14 in a memory cell formation region. Moreover, a gate electrode 18 is formed on a region between the source and drain regions 22 with a gate insulating film 16 interposed therebetween. A transistor 26 of a memory cell is formed which includes the source and drain regions 22 and the gate electrode 18. Note that a silicide film 24a is formed on the gate electrode 18, and a silicide film 24b is formed on each of the surfaces of the source and drain regions 22. Moreover, side walls 20 are formed on both sides of the gate electrode 18, respectively.

The transistor 26 is covered with an insulating film 28. An interlayer insulating film 30 is formed on the insulating film 28. A conductive plug 36 is embedded in the interlayer insulating film 30 and the insulating film 28. The conductive plug 36 is a high-melting-point metal such as W (tungsten) filled into a contact hole 32 which extends from the top surface of the interlayer insulating film 30 to the silicide film 24b. A wall surface of the contact hole 32 is covered with an adhesion layer 34, which secures the adhesion between the conductive plug 36 and the silicide film 24b.

An interlayer insulating film 42 is formed on the interlayer insulating film 30. In the first embodiment, the interlayer insulating film 42 has a structure in which a SiN film 38 and $SiO_2$ film 40 are stacked on each other.

A ferroelectric capacitor 62 is formed on a predetermined region of the interlayer insulating film 42 with an adhesion layer 43 interposed therebetween. The ferroelectric capacitor 62 has a structure in which a lower electrode 48, a dielectric film 50, and an upper electrode 60 are stacked in this order from the bottom. The dielectric film 50 is formed of an oxide having ferroelectric characteristics. Examples of the oxide having ferroelectric characteristics include oxides each having a perovskite structure such as PZT, PLZT, and CSPLZT, and oxides each having a bismuth layered crystal structure, such as BST, BLT, and BFO. These oxides are represented by a chemical formula ABOx (provided that A and B are metal elements, and 0<x).

The lower electrode 48 has a structure in which a conductive film 44 and a noble metal film 46 are staked on each other. The upper electrode 60 has a structure in which a conductive oxide film 52, a conductive film 56, and a conductive film 58 are stacked in this order form the bottom. Of these films, the conductive oxide film 52 is formed of a material to which conductivity is provided by adding a metal element (conductive material) such as Ir (iridium) or Ru (ruthenium) to a ferroelectric material.

The ferroelectric capacitor 62 is covered with a protection film 64. A protection film 66 is formed on the interlayer insulating film 42 and the protection film 64. These protection films 64 and 66 prevent entry of hydrogen and water, which cause deterioration in characteristics of the ferroelectric capacitor 62.

An interlayer insulating film 68 is formed on the protection film 66. A protection film 70 is formed on the interlayer insulating film 68. In addition, an interlayer insulating film 72 is formed on the protection film 70, and wirings 90 are formed in a predetermined pattern on the interlayer insulating film 72. In the first embodiment, each of the wirings 90 has a structure in which a TiN film 82, an AlCu alloy film 84, a Ti film 86, and a TiN film 88 are stacked on each other.

The lower electrode 48 of the ferroelectric capacitor 62 is electrically connected to a predetermined wiring 90 through a conductive plug 80a. The upper electrode 60 is electrically connected to another wiring 90 through a conductive plug 80b. Meanwhile, each of the source and drain regions 22 of the transistor 26 is electrically connected to still another wiring 90 through the silicide film 24b, the conductive plug 36, and a conductive plug 80c.

The conductive plugs 80a, 80b, and 80c are formed by filling a high-melting-point metal such as W (tungsten) into the contact holes 74a, 74b, and 76 provided in the interlayer insulating film 72, the protection film 70, and the interlayer insulating film 68, respectively. An adhesion layer 78 is formed between the high-melting-point metal and the wall surface of each of the contact holes 74a, 74b, and 76.

The semiconductor device of the first embodiment has the conductive oxide film 52 on the dielectric film 50 as described above. The conductive oxide film 52 is formed of a material to which conductivity is provided by adding a metal element such as Ir or Ru to a ferroelectric material. This suppresses the formation of the paraelectric layer due to the interdiffusion between the dielectric film 50 and the upper electrode 60 as described later. This, in turn, may allow a low-voltage operation, and enable favorable ferroelectric characteristics to be obtained even when the thickness of the dielectric film 50 is reduced.

Hereinafter, a method of manufacturing a semiconductor device according to the first embodiment will be described.

Figure 10A:
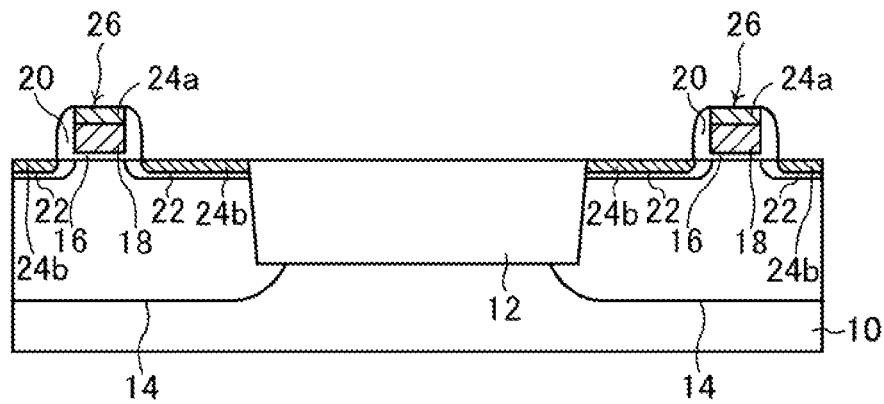
FIGS. 10A to 10U are cross-sectional views illustrating a method of manufacturing a semiconductor device according to the first embodiment.
Figure 10B:
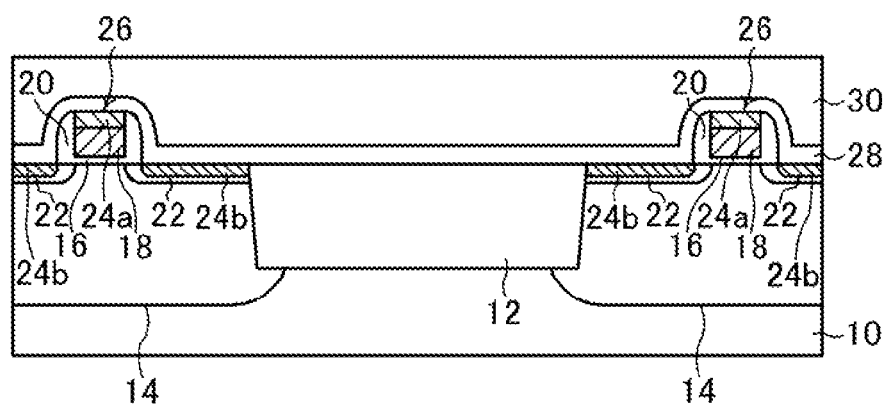
Figure 10C:
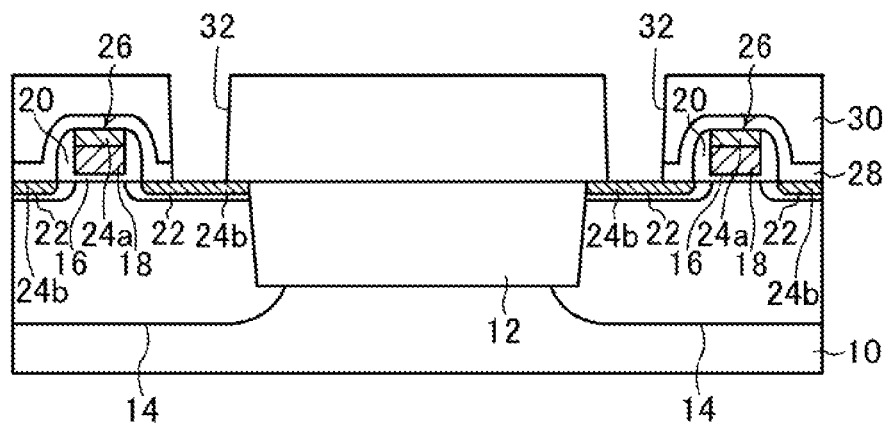
Figure 10D:
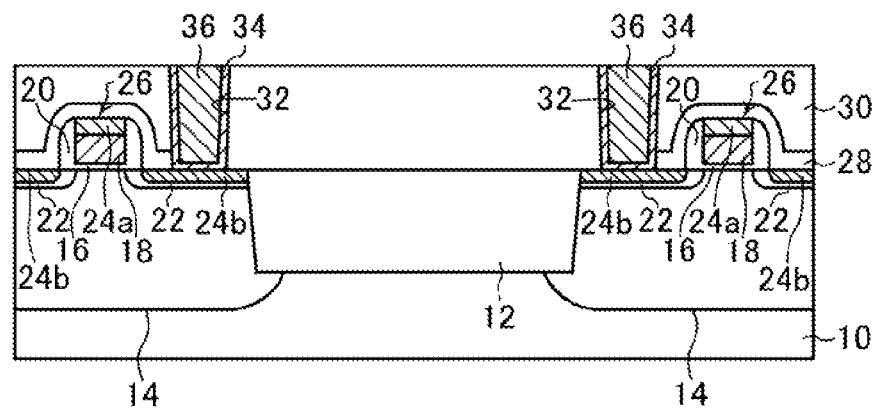
Figure 10E:
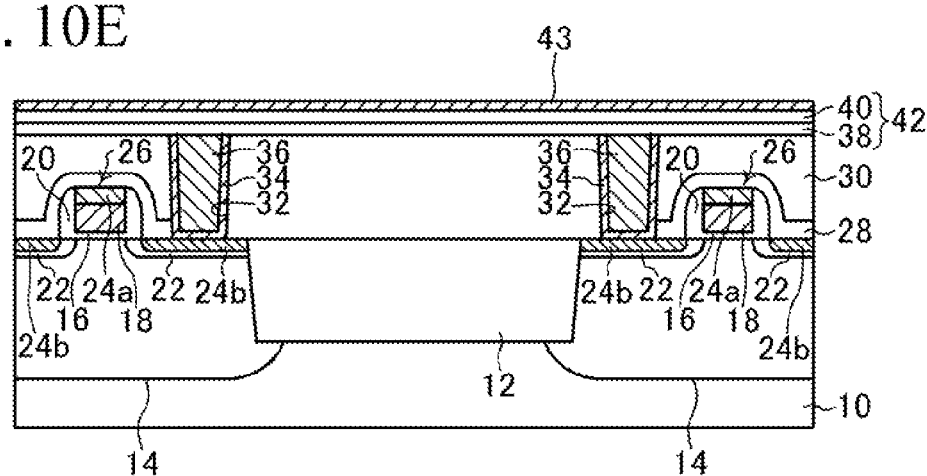
Figure 10F:
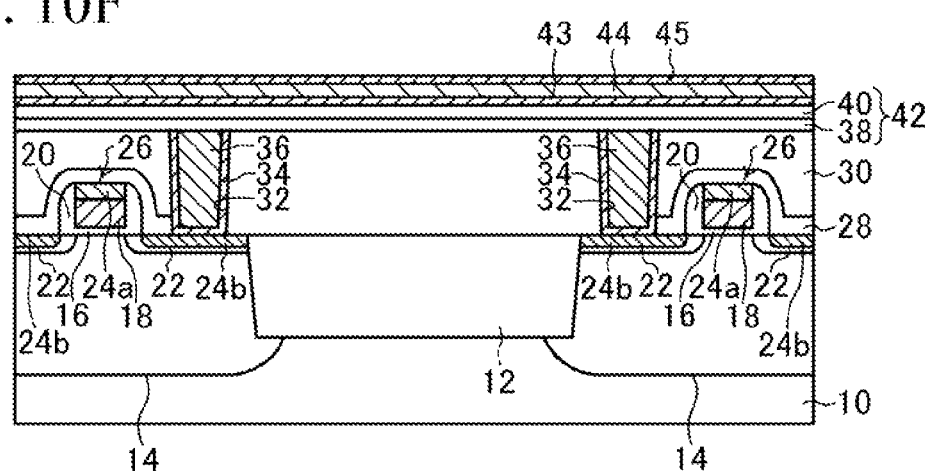
Figure 10G:
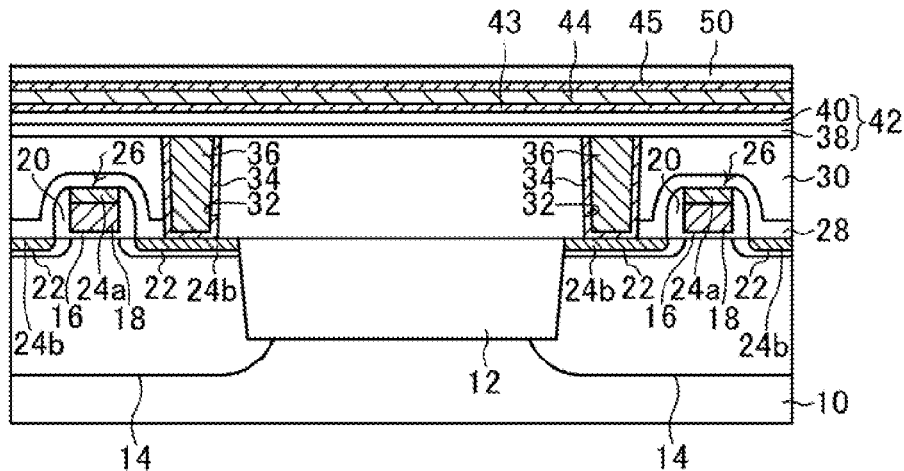
Figure 10H:
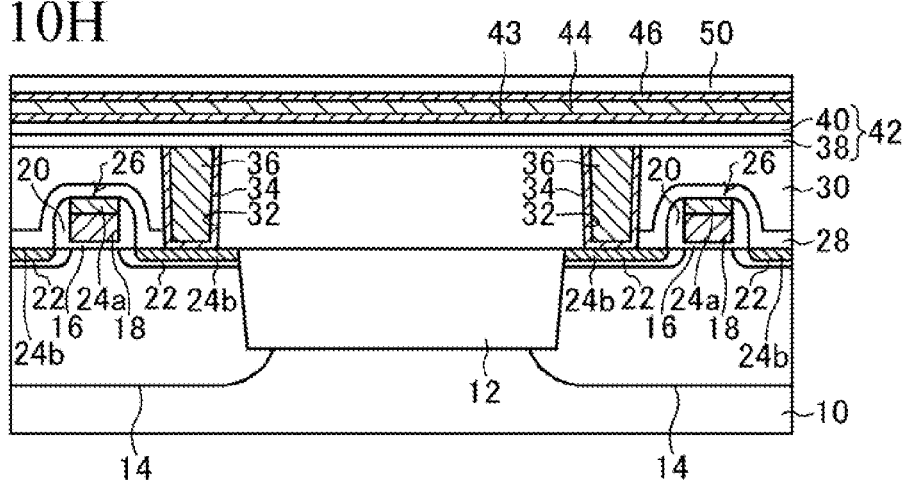
Figure 10I:
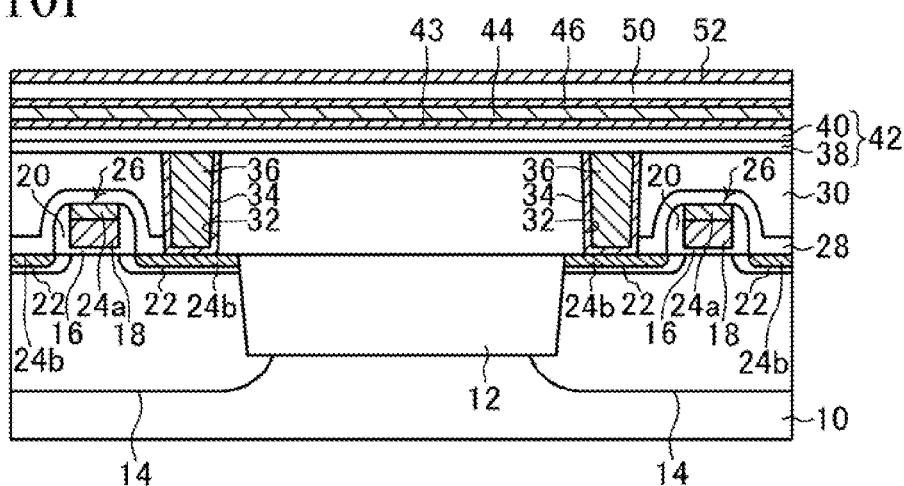
Figure 10J:
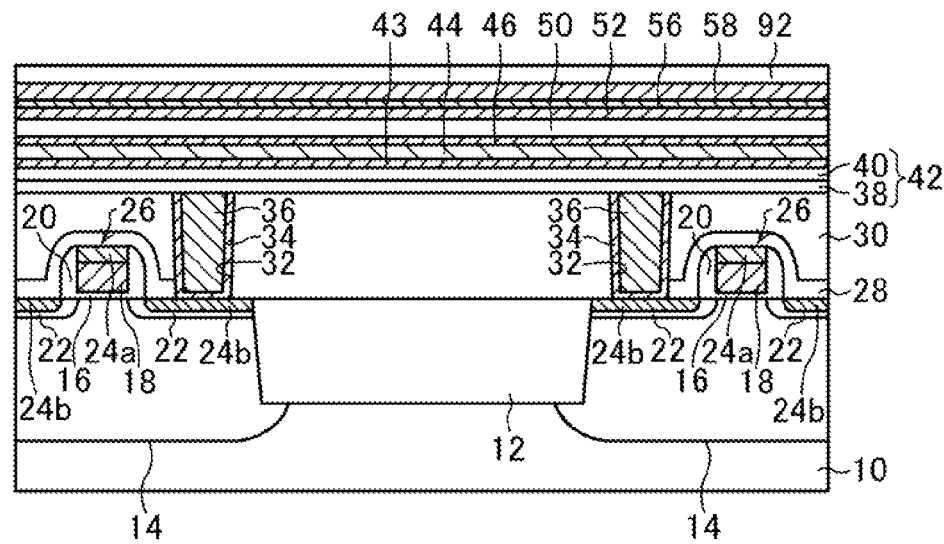
Figure 10K:
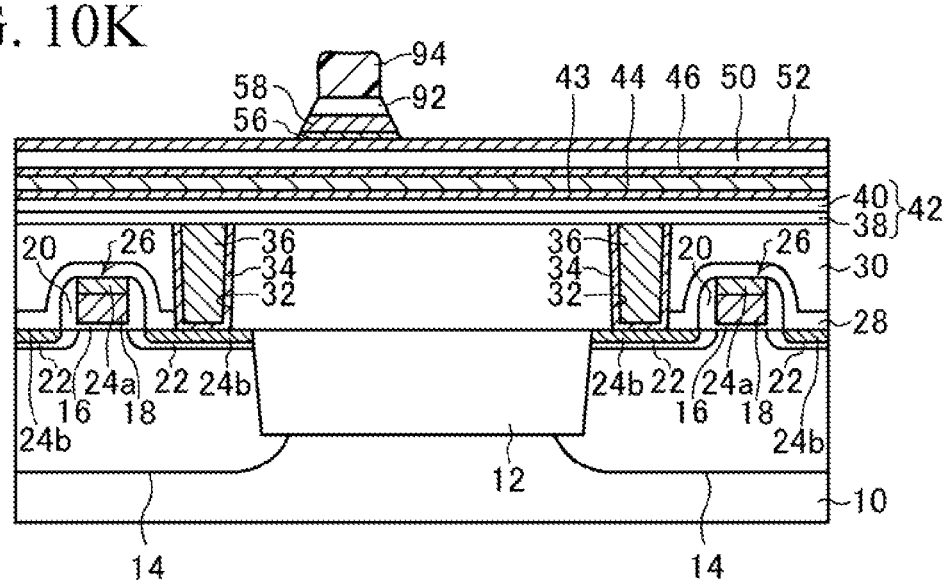
Figure 10L:
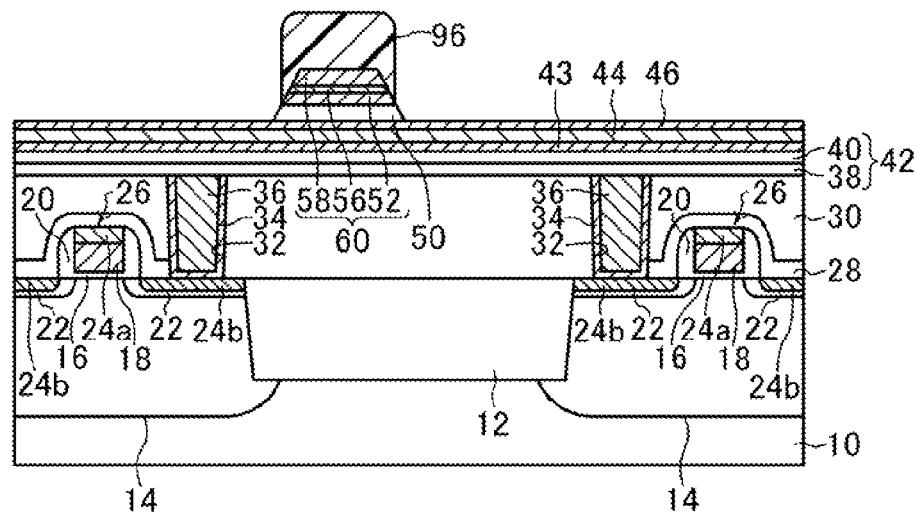
Figure 10M:
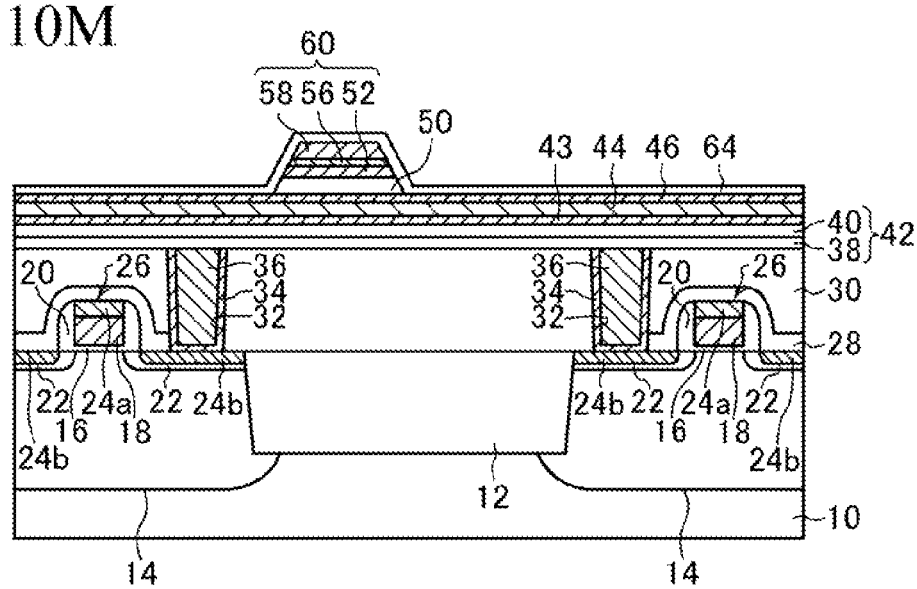
Figure 10N:
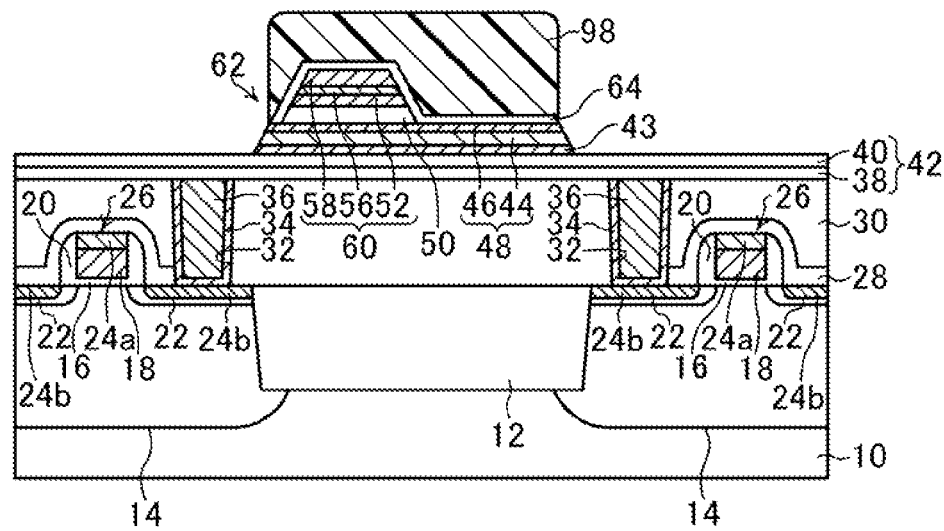
Figure 10O:
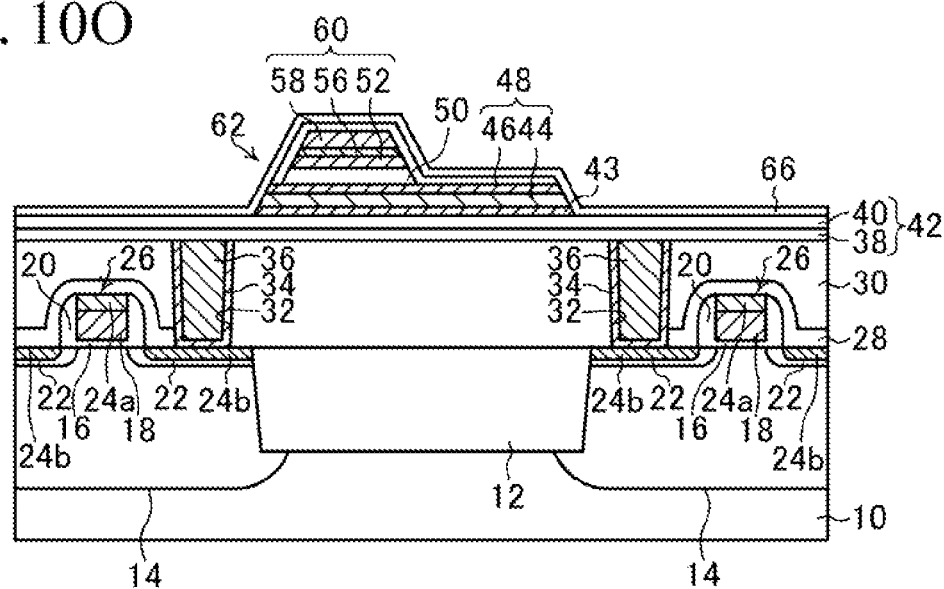
Figure 10P:
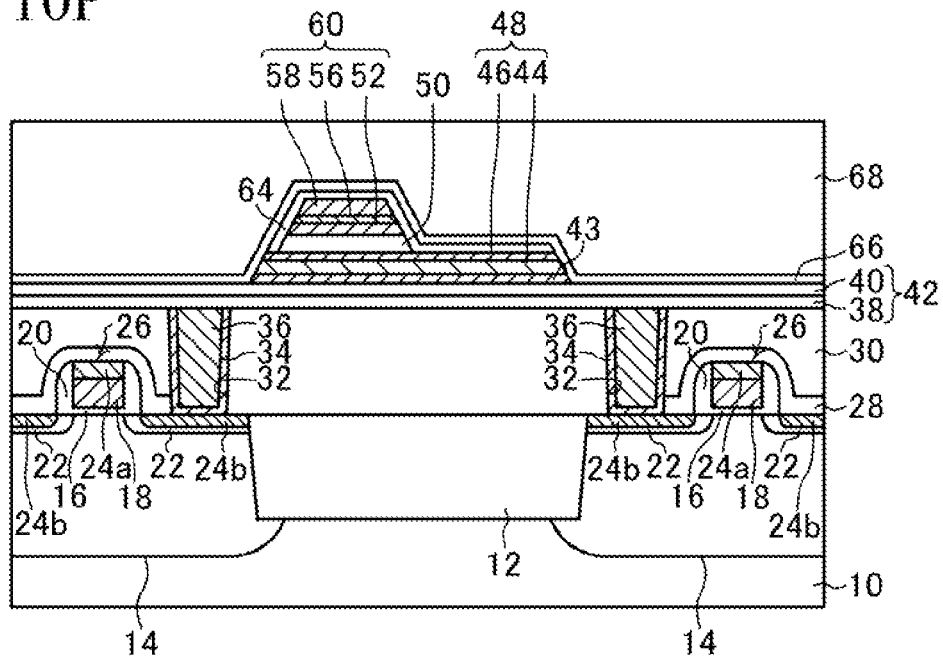
Figure 10Q:
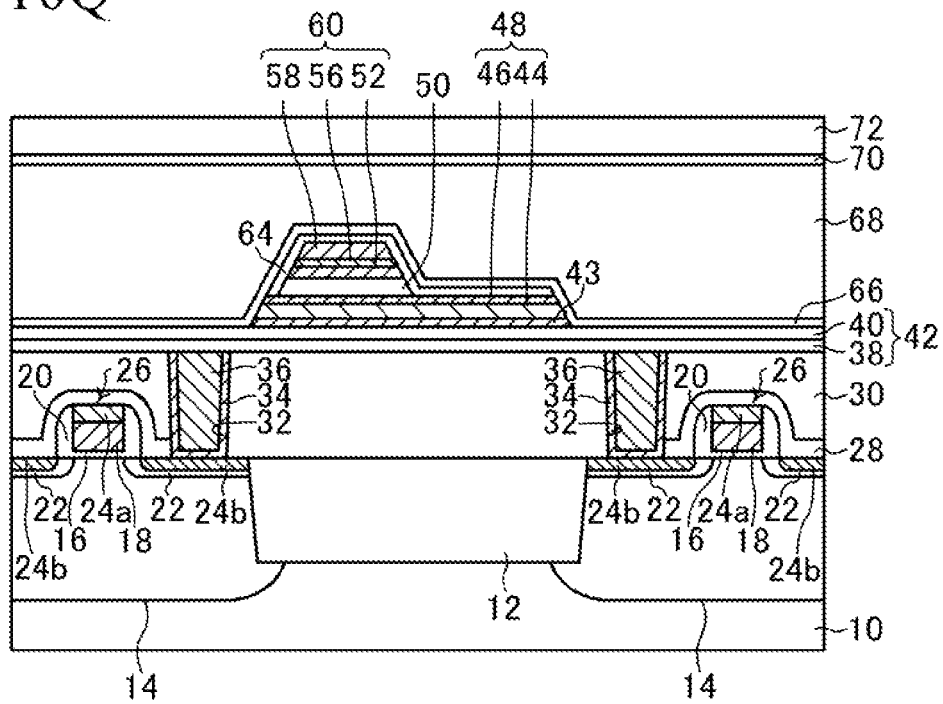
Figure 10R:
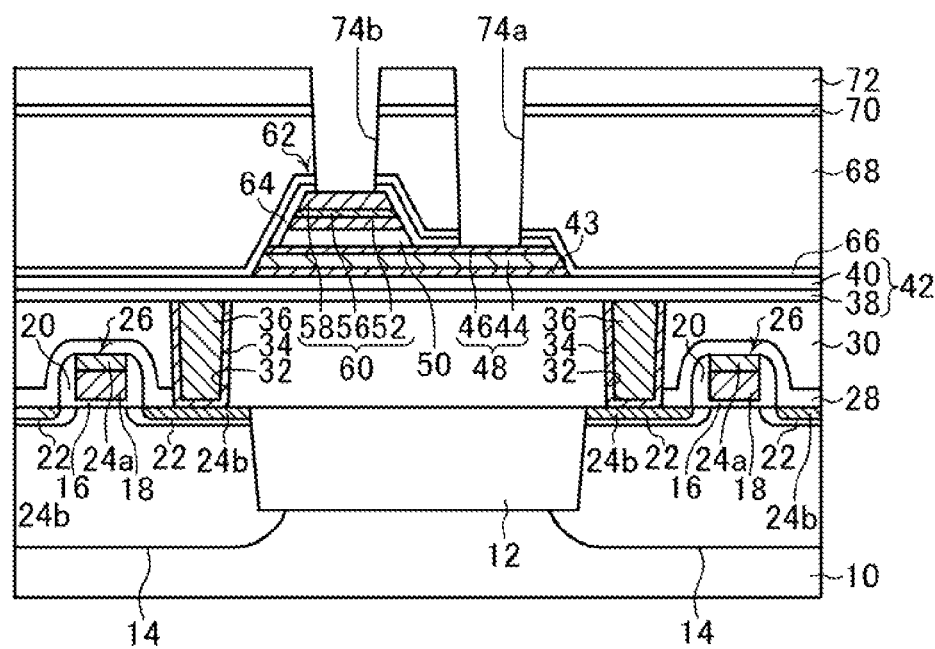
Figure 10S:
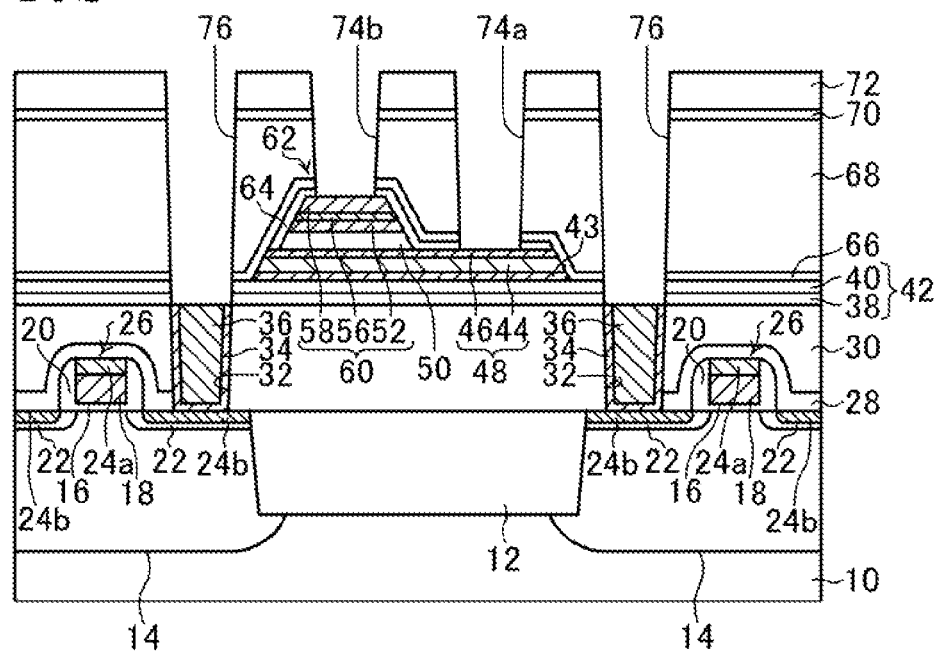
Figure 10T:
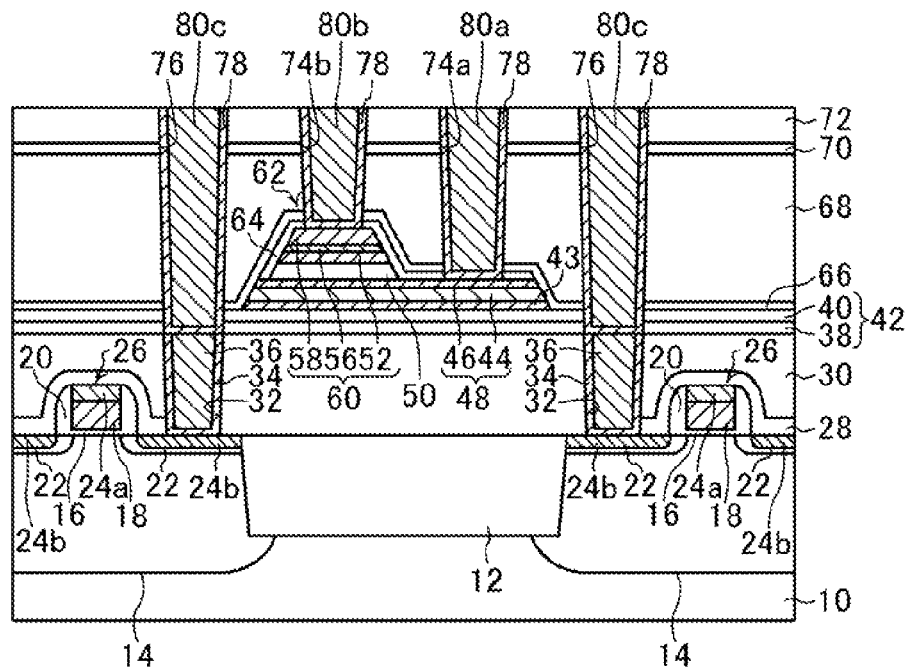
Figure 10U:
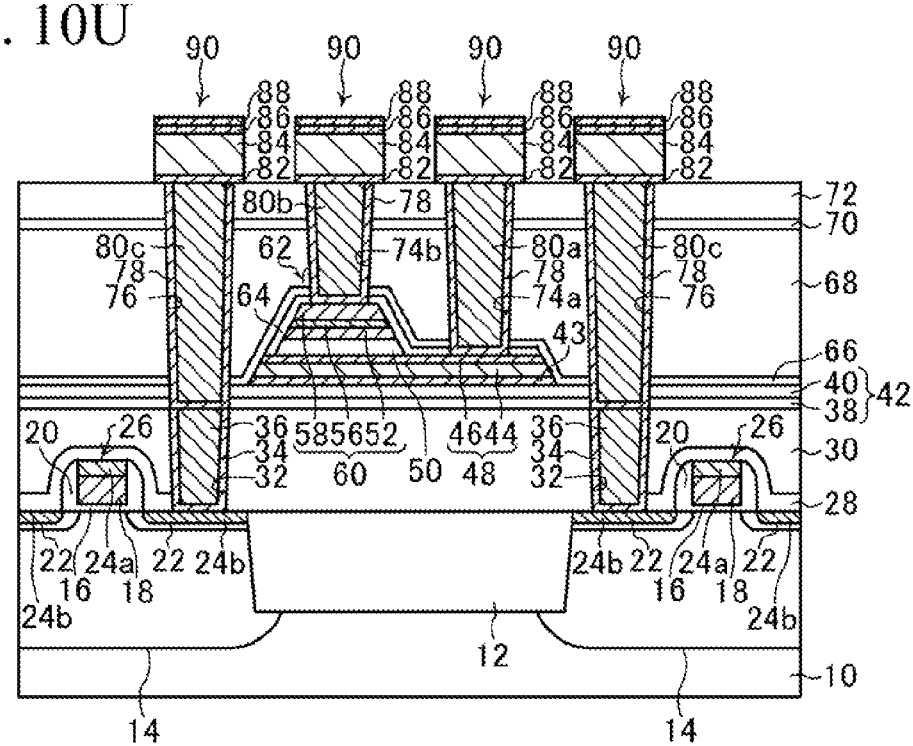

FIGS. 10A to 10U are cross-sectional views sequentially illustrating steps of the method of manufacturing a semiconductor device according to the first embodiment.

First, a step of obtaining the structure in FIG. 10A is described. First, a semiconductor substrate (silicon substrate) 10 is prepared, and an element isolation film 12 is formed in the semiconductor substrate 10 by a known STI (Shallow Trench Isolation) method, a LOCOS (Local Oxidation of Silicon) method, or the like. Each region surrounded by the element isolation film 12 serves as an element formation region in which an element such as a transistor is to be formed.

Thereafter, impurities are introduced into the element formation region of the semiconductor substrate 10 by, for example, an ion implantation method. Thus, a well 14 is formed. Here, p-type impurities such as B (boron) are introduced into an n-type transistor formation region to form a p well, whereas n-type impurities such as P (phosphorus) are introduced into a p-type transistor formation region to form a n well.

Next, the surface of the well 14 is thermally oxidized to form a gate insulating film 16. The gate insulating film 16 has a thickness of, for example, 6 nm to 7 nm. Thereafter, a polysilicon film having, for example, a thickness of 180 nm is formed on the entire top surface of the semiconductor substrate 10 by, for example, a CVD (Chemical Vapor Deposition) method. Then, the polysilicon film is patterned to form a gate electrode 18 by use of a photolithography method and an etching method. Note that the gate electrode 18 of the transistor 26, which is to be connected to the ferroelectric capacitor 62 to constitute a memory cell, serves as a word line.

Next, impurities are introduced shallowly into the well 14 at a low concentration by an ion implantation method or the like using the gate electrode 18 as a mask. Thus, a low concentration impurity region to serve as an extension is formed. In this case, n-type impurities such as P (phosphorus) or As (arsenic) are introduced into an n-type transistor formation region, whereas p-type impurities such as B (boron) are introduced into a p-type transistor formation region.

Next, sidewalls 20 are formed on both sides of the gate electrode 18, respectively. The sidewalls 20 may be formed by first forming an insulating film of SiO₂ (silicon oxide), SiN (silicon nitride), or the like having a thickness of about 300 nm on the entire top surface of the semiconductor substrate 10 by, for example, a CVD method, and then anisotropically etching the insulating film.

After that, impurities are ion implanted into the well 14 at a high concentration by use of the gate electrode and the sidewalls 20 as a mask. Thus, a high-concentration impurity region is formed. In this case, n-type impurities such as P (phosphorus) or As (arsenic) are introduced into a well in an n-type transistor formation region, whereas p-type impurities such as B (boron) are introduced into a well in a p-type transistor formation region. Each of the source and drain regions 22 having the low-concentration impurity region (extension) and the high-concentration impurity region is thus formed.

Next, a high-melting-point metal film made of a high-melting-point metal such as Co (cobalt) is formed on the entire top surface of the semiconductor substrate 10 by, for example, a sputtering method. Then, a heat treatment is conducted at a predetermined temperature. The heat treatment causes silicon and the high-melting-point metal to react with each other at the interface between the high-melting-point metal film and the gate electrode 18 and at the interfaces between the high-melting-point metal film and the source and drain regions 22. As a result, a silicide is formed. Thereafter, the unreacted high-melting-point metal is removed by wet-etching or the like. Thus, a silicide film 24a is formed on the surface of the gate electrode 18, and a silicide film 24b is formed on the surface of each of the source and drain regions 22.

Next, a step of obtaining the structure in FIG. 10B is described. After the formation of the silicide films 24a and 24b in the above-described step, SiON (silicon oxynitride) is deposited on the entire top surface of the semiconductor substrate 10 in a thickness of approximately 200 nm by, for example, a plasma CVD method. Thus, an insulating film 28 is formed. Thereafter, SiO₂ is deposited on the insulating film 28 in a thickness of approximately 1 μm by, for example, a plasma CVD method using TEOS (Tetra Ethoxy Silane) gas. Thus, an interlayer insulating film 30 is formed. Subsequently, the interlayer insulating film 30 is polished to make a surface thereof flat by, for example, a CMP (Chemical Mechanical Polishing) method. The height from the top surface of the semiconductor substrate 10 (the well 14) to the top surface of the interlayer insulating film 30 is, for example, about 785 nm after the CMP.

Next, a step of obtaining the structure in FIG. 10C is described. After the formation of the interlayer insulating film 30 in the above-described step, a contact hole 32 is formed by conducting a photolithography process and an etching process. The contact hole 32 extends from the top surface of the interlayer insulating film 30 to the silicide film 24b. The contact hole 32 has a diameter of, for example, 0.25 μm.

Next, a step of obtaining the structure of FIG. 10D is described. After the formation of the contact hole 32 in the above-described step, a Ti (titanium) film having a thickness of 30 nm is formed on the entire top surface of the semiconductor substrate 10 by, for example, a sputtering method. Further, a TiN (titanium nitride) film having a thickness of 20 nm is formed on the Ti film. Thus, an adhesion layer 34 having a layered structure of the Ti film and the TiN film is obtained. The surface in the contact hole 32 is covered with the adhesion layer 34.

Next, a conductive material such as W (tungsten) is deposited on the entire top surface of the semiconductor substrate 10 by, for example, a CVD method. Thus, the contact hole 32 is filled with the conductive material. Thereafter, the conductive material and the adhesion layer 34 on the interlayer insulating film 30 are removed by, for example, a CMP method to an extent that the interlayer insulating film 30 is exposed. The conductive material left in the contact hole 32 is to be a conductive plug 36.

Next, a step of obtaining the structure in FIG. 10E is described. After the formation of the conductive plug 36 in the above-described step, a SiN film 38 having a thickness of approximately 100 nm is formed on the entire top surface of the semiconductor substrate 10 by, for example, a plasma CVD method. Thereafter, a $SiO_2$ film 40 having a thickness of approximately 130 nm is formed on the SiN film 38 by, for example, a plasma TEOS CVD method. An interlayer insulating film 42 is formed by the SiN film 38 and the $SiO_2$ film 40. The interlayer insulating film 42 is intended to prevent oxidation of the conductive plug 36. The interlayer insulating film 42 may be formed of an insulating material such as SiN or $Al_2O_3$ (aluminum oxide).

Next, gas contained in the interlayer insulating film 42 is released from the interlayer insulating film 42 by a heat treatment, for example, in a nitrogen atmosphere at a temperature of 650° C. for 30 minutes. Thereafter, an $Al_2O_3$ film having a thickness of 20 nm is formed on the interlayer insulating film 42 by, for example, a sputtering method. Thus, an adhesion layer 43 is formed. The adhesion layer 43 is intended to secure the adhesion of a conductive film 44 to be formed next.

Next, a step of obtaining the structure in FIG. 10F is described. After the formation of the adhesion layer 43 in the above-described step, a conductive film 44 having a thickness of 50 nm to 150 nm is formed on the adhesion layer by, for example, a sputtering method. Here, a Pt (platinum) film is formed as the conductive film 44. Film formation conditions for formation of the Pt film are, for example, as follows. A substrate temperature is 350° C., Ar gas is used as a gas introduced into a film formation chamber, a pressure in the film formation chamber is 1 Pa, and a supply power is 0.3 kW.

Note that an Ir film, a Ru film, a $RuO_2$ film, a $SrRuO_2$ film, or a layered film thereof may be used as the conductive film 44.

Next, an amorphous noble metal oxide film 45 is formed on the conductive film 44 by, for example, a sputtering method. The noble metal element contained in the noble metal oxide film 45 is preferably the same as the noble metal element contained in the conductive film 44. Here, a PtOx (platinum oxide) film is formed as the noble metal oxide film 45. In this case, the PtOx film is converted into a Pt film by being reduced in a heat treatment process to be described later. Note that the noble metal oxide film 45 may be formed of IrOx, $SrRuO_3$, or $LaSrCoO_3$.

When the film thickness of the noble metal oxide film 45 is less than 0.1 nm, the amount of oxygen released from the noble metal oxide film 45 in the heat treatment process to be described later is so small that the oxygen deficiency in a dielectric film 50 formed on the noble metal oxide film 45 may not be compensated sufficiently. On the other hand, when the film thickness of the noble metal oxide film 45 is more than 3 nm, it is difficult to transfer the crystallinity of the conductive film 44 to the dielectric film 50 through the noble metal oxidation 45. For this reason, the thickness of the noble metal oxide film 45 is preferably 0.1 nm to 3 nm.

Next, a step of obtaining the structure in FIG. 10G is described. After the formation of the noble metal oxide film 45 in the above-described step, a dielectric film 50 made of a ferroelectric material is formed on the noble metal oxide film 45 by, for example, a high-frequency sputtering method. In the first embodiment, a PZT film to which Ca, Sr, and La are added, i.e. a CSPLZT film is used as the dielectric film 50. The film thickness of the dielectric film 50 is, for example, 30 nm to 150 nm, and preferably 50 nm to 120 nm. In the first embodiment, the film thickness of the dielectric film 50 is 70 nm.

The temperature during the film formation of the dielectric film 50 is preferably 30° C. to 100° C. If the film formation temperature of the dielectric film 50 is lower than 30° C., the in-plane variation of the film thickness of the dielectric film 50 is great, and the crystallinity becomes heterogeneous. On the other hand, if the film formation temperature of the dielectric film 50 is higher than 100° C., the percentages of the (101) orientation and the (100) orientation is increased in the dielectric film 50, and the percentage of the (111) orientation is reduced, so that the characteristics of the ferroelectric capacitor 62 deteriorate. In the first embodiment, the film formation temperature of the dielectric film 50 is 50° C.

Note that the dielectric film 50 may be formed by a method other than the sputtering method, such as a MOCVD (Metal Organic chemical Vapor Deposition) method, a sol-gel method, a MOD (Metal-Organic Decomposition) method, a CSD (Chemical Solution Deposition) method, a CVD method, an epitaxial growth method, or the like. Moreover, the dielectric film 50 may be formed of a ferroelectric material other than PZT ($Pb(Zr,Ti)O_3$), such as PLZT($(Pb,La)(Zr,Ti)O_3$), BST ($Ba_xSr_{1-x})TiO_3$), BLT (($Bi,La)_4Ti_3O_{12}$), or BFO ($BiFeO_3$).

Next, a method of obtaining the structure in FIG. 10H is described. After the formation of the dielectric film 50 in the above-described step, the dielectric film 50 is crystallized by carrying out a rapid heat treatment (rapid thermal annealing, hereinafter referred to as RTA). Specifically, the semiconductor substrate 10 is held in an atmosphere of a mixture gas containing an inert gas (for example, Ar) and $O_2$ (oxygen) at a temperature of 550° C. to 650° C. for approximately 90 seconds. To improve the crystallinity of the dielectric film 50, the flow rate of the $O_2$ gas is preferably 20 sccm to 70 sccm.

In the first embodiment, the dielectric film 50 is formed on the noble metal oxide film 45, and the dielectric film 50 is crystallized by the heat treatment. Hence, even when the crystallinity of the conductive film 44 is insufficient, a dielectric film 50 with a favorable crystallinity may be obtained. In addition, the amorphous noble metal oxide film (PtOx film) 45 is reduced in the heat treatment, and converted into a noble metal film (Pt film) 46. Moreover, oxygen is released from the noble metal oxide film 45 during the heat treatment. The oxygen released from the noble metal oxide film 45 compensates the oxygen deficiency in the dielectric film 50. As a result, a dielectric film 50 having a favorable crystallinity and favorable ferroelectric characteristics may be obtained.

Next, a step of obtaining the structure in FIG. 10I is described. After the crystallization of the dielectric film 50 by the above-described heat treatment process, an amorphous conductive oxide film 52 is formed on the dielectric film 50 by, for example, a sputtering method. Specifically, a conductive oxide film 52 is formed by a high-frequency sputtering method using a target of a ferroelectric material to which a conductive material such as Ir or Ru is added, i.e., ($Pb(Zr,Ti,Ir)O_3$ or $Pb(Zr,Ti,Ru)O_3$, or the like. At this time, the film formation temperature is room temperature to 50° C., Ar gas is supplied to a film formation chamber at a flow rate of 14 sccm to 20 sccm, and the pressure in the film formation chamber is 1 Pa, for example. For example, PZT, PLZT, CSPLZT, BST, BLT, BFO, or the like may be used as the ferroelectric material to be used as the target.

Note that the conductive oxide film 52 may be formed by a method such as a MOCVD method, a sol-gel method, a MOD method, a CSD method, a CVD method, or an epitaxial growth method.

If the percentage content of the conductive material in the conductive oxide film 52 is less than 0.8 mol %, a sufficient conductivity may not be provided to the conductive oxide film 52. If the percentage content is not less than 1.0 mol %, the resistance of the conductive oxide film 52 is sharply reduced. For this reason, the percentage content of the conductive material in the conductive oxide film 52 is preferably 1.0 mol % or more, and further preferably 2 mol % or more. On the other hand, if the percentage content of the conductive material in the conductive oxide film 52 exceeds 4.0 mol %, the amount of the conductive material diffused from the conductive oxide film 52 to the dielectric film 50 is increased, so that the effect of suppressing the formation of the paraelectric layer may not be obtained sufficiently.

For this reason, the percentage content of the conductive material in the conductive oxide film 52 is preferably 1.0 mol % to 4.0 mol %. In the first embodiment, the conductive oxide film 52 is formed of a PZT having an Ir percentage content of 2 mol % (hereinafter also referred to as PZT(Ir)).

Moreover, if the film thickness of the conductive oxide film 52 is too small, the effect of improving the characteristics of the ferroelectric capacitor is not sufficient. Meanwhile, if film thickness is too large, the resistance of the upper electrode 60 is increased, and the processability (etching property) becomes poor. For this reason, the thickness of the conductive oxide film 52 is preferably 0.1 nm to 50 nm, and further preferably 5.0 nm to 40 nm.

Next, a step of obtaining the structure in FIG. 10J is described. After the formation of the conductive oxide film 52 in the above-described step, a conductive film 56 made of, for example, IrOx (iridium oxide) and having a thickness of 20 nm to 50 nm is formed on the conductive oxide film 52. The conductive film 56 may be formed by use of, for example, a reactive sputtering apparatus with Ir being used as a target. The conditions for the formation of the conductive film 56 are, for example, as follows. A substrate temperature is 150° C. to 350° C., a mixture gas containing Ar and $O_2$ is introduced into a film formation chamber of the sputtering apparatus. In this case, for example, the flow rate of the $O_2$ gas is 60 sccm, the pressure in the film formation chamber is 2.0 Pa, and the supply power is about 1 kW. When the conductive film 56 is formed under such conditions at a relatively high-temperature, the conductive film 56 is already crystallized at the formation of the film.

Next, the semiconductor substrate 10 on which the conductive film 56 is formed is subjected to a heat treatment (RTA), for example, in an atmosphere containing oxygen. The heat treatment further improves the crystallinity of the dielectric film 50, and the conductive oxide film 52 crystallizes while succeeding to the crystallinity of the dielectric film 50. At this time, the Ir percentage content in the conductive oxide film 52 is as less as 1.0 mol % to 4.0 mol %, and most of 1$r$ is incorporated into the crystals of the ferroelectric. For this reason, the amount of 1$r$ diffused from the conductive oxide film 52 to the dielectric film 50 is small.

Next, an IrOx (provided that 0<x≤2) film having a thickness of 70 nm to 200 nm is formed on the conductive film 56 as a conductive film 58 by, for example, a sputtering method. In this case, the composition ratio of oxygen in the IrOx film forming the conductive film 58 is preferably greater than the composition ratio of oxygen in the IrOx film forming the conductive film 56. This enhances the effect of preventing the diffusion of hydrogen to the dielectric film 50, so that the conductive film 58 sufficiently functions also as a hydrogen barrier film.

In the formation of the conductive film 58 by a sputtering method, for example, Ar gas at a flow rate of 100 sccm and $O_2$ gas at a flow rate of 100 sccm are supplied into a film formation chamber of a sputtering apparatus. In addition, the pressure in the film formation chamber is 0.8 Pa, the supply power is 1.0 kW, and the film formation time is about 59 seconds. When the conductive film 58 is formed under such conditions, the conductive film 58 has a thickness of approximately 150 nm.

Next, the dielectric film attached to the back surface of the semiconductor substrate 10 is removed by conducting a cleaning treatment. Thereafter, a TiN film having a thickness of approximately 34 nm is formed as a protection film 92 on the conductive film 58 by, for example, a sputtering method. The protection film 92 has a barrier function against reducing substances, and also functions as a hard mask used when the conductive film 56 and the conductive film 58 are patterned as described later.

In the formation of the protection film 92, a Ti target is used, the substrate temperature is 150° C., and a mixture gas containing Ar and $N_2$ (nitrogen) is used as a gas introduced into a film formation chamber, for example. The flow rate of the Ar gas is, for example, 50 sccm, and the flow rate of the $N_2$ gas is, for example, 90 sccm.

Note that, a TiN film is used as the protection film 92 in the first embodiment. However, a TaN film, a TiON film, a TiOx film, a TaOx film, a TaON film, a TiAlOx film, a TaAlOx film, a TiAlON film, a TaAlON film, a TiSiON film, a TaSiON film, a TiSiOx film, a TaSiOx film, an AlOx film, a ZrOx film, or the like may be used as the protection film 92.

Next, a step of obtaining the structure in FIG. 10K is described. After the formation of the protection film 92 in the above-described step, a photoresist film 94 is formed on the protection film 92 by, for example, a spin coating method. Then, the photoresist film 94 is patterned into a predetermined shape by conducting an exposure process and a development process. Thereafter, the protection film 92, the conductive film 58, and the conductive film 56 are sequentially etched by use of the photoresist film 94 as a mask.

Next, a step of obtaining the structure in FIG. 10L is described. After the etching of the protection film 92, the conductive film 58, and the conductive film 56 in the above-described step, the photoresist film 94 is peeled off. Thereafter, the protection film 92 is removed by, for example, dry etching.

Next, the semiconductor substrate 10 is subjected to a heat treatment in an atmosphere containing oxygen. The heat treatment is intended to recover the damage inflicted on the dielectric film 50 during the previous steps. The temperature of the heat treatment is, for example, 600° C. to 700° C. In the first embodiment, the heat treatment is conducted at a temperature of 650° C. for 40 minutes.

Next, a photoresist is applied onto the entire top surface of the semiconductor substrate 10, and then an exposure process and a development process are conducted. Thus, a photoresist film 96 is formed which covers a predetermined region (upper electrode formation region) including the conductive film 58 and the conductive film 56. Thereafter, the conductive oxide film 52 and the dielectric film 50 are etched by use of the photoresist film 96 as a mask. In this manner, the dielectric film 50 is patterned into a predetermined shape, and an upper electrode 60 is formed by the conductive oxide film 52, the conductive film 56, and the conductive film 58.

Next, a step of obtaining the structure of FIG. 10M is described. After the completion of the patterning of the dielectric film 50 and the formation of the upper electrode 60 in the above-described step, the photoresist film 96 is peeled off. Thereafter, the damage inflicted on the dielectric film 50 is recovered by conducting a heat treatment, for example, in an oxygen atmosphere at a temperature of 300° C. to 650° C. for 30 minutes to 120 minutes.

Next, a protection film 64 is formed on the entire top surface of the semiconductor substrate 10 by, for example, a sputtering method or a CVD method. The protection film 64 is intended to prevent the entry of hydrogen and water to the ferroelectric capacitor 62. The protection film 64 is made of, for example, an insulating material such as AlOx (aluminum oxide), and has a thickness of, for example, 20 nm to 50 nm. Note that, the protection film 64 may be formed of TiOx (titanium oxide), TaOx (tantalum oxide), ZrOx (zirconium oxide), TaN (tantalum nitride), AlN (aluminum nitride), AlON (aluminum oxynitride), or the like.

When the protection film 64 is formed of AlOx, for example, a reactive RF sputtering apparatus and an AlOx target are used. In addition, Ar gas is introduced into a film formation chamber of the sputtering apparatus, the pressure in the film formation chamber is approximately 1.0 Pa, the temperature during the film formation is room temperature, the supply power is 2.0 kW, and the film formation time is 40 seconds to 100 seconds, for example.

After the formation of the protection film 64, a heat treatment is conducted at a temperature of, for example, 400° C. to 600° C. for 30 minutes to 120 minutes.

Next, a step of obtaining the structure of FIG. 10N is described. After the formation of the protection film 64 in the above-described step, a photoresist film 98 is formed on the entire surface of the protection film 64, and an exposure process and a development process are conducted. Thus, the photoresist film 98 is patterned into a predetermined shape (shape of a lower electrode).

Next, the protection film 64, the noble metal film 46, the conductive film 44, and the adhesion layer 43 are sequentially etched by use of the photoresist film 98 as a mask. The conductive film 44 and the noble metal film 46 remaining after the etching form the lower electrode 48. Thus, a ferroelectric capacitor 62 is formed.

Next, a step of forming the structure in FIG. 10O is described. After the etching of the protection film 64, the noble metal film 46, the conductive film 44, and the adhesion layer 43 in the above-described step, the photoresist film 98 is peeled off. Thereafter, water and impurities are removed by subjecting the semiconductor substrate 10 to a heat treatment, for example, in an atmosphere containing oxygen or containing oxygen and an inert gas at a temperature of 200° C. to 400° C. for 30 minutes to 120 minutes.

Next, a protection film 66 is formed by depositing an insulating material such as AlOx on the entire top surface of the semiconductor substrate 10 by, for example, a sputtering method or a CVD method. Thus, the ferroelectric capacitor 62 is covered with the protection film 66. When the protection film 66 is formed by a sputtering method, the film thickness is preferably 10 nm to 30 nm, and may be 20 nm, for example. Meanwhile, when the protection film 66 is formed by a CVD method, the film thickness is preferably 1 nm to 3 nm, and may be 2 nm, for example.

When the protection film 66 is formed of AlOx, a reactive RF sputtering apparatus is used, for example. Here, Ar gas is introduced into a film formation chamber of the sputtering apparatus, the pressure in the film formation chamber is approximately 1.0 Pa, the temperature during film formation is room temperature, the supply power is 2.0 kW, and the film formation time is approximately 40 seconds. As a result, a very dense protection film 66 made of AlOx may be obtained. Note that the protection film 66 may be formed of TiOx, TaOx, ZrOx, TaN, AlN, AlON, or the like.

Next, the semiconductor substrate 10 is subjected to a heat treatment, for example, in an atmosphere containing oxygen at a temperature of 500° C. to 700° C. for 30 minutes to 120 minutes. The heat treatment is intended to recover the damage inflicted on the dielectric film 50 by the sputtering, and to improve the electrical characteristics of the ferroelectric capacitor 62.

Next, a step of obtaining the structure of FIG. 10P is described. After the heat treatment is conducted on the protection film 66 in the above-described step, an interlayer insulating film 68 is formed on the protection film 66 by, for example, a plasma TEOS CVD method. The interlayer insulating film 68 is formed of, for example, $SiO_2$, and has a thickness of, for example, 1.4 µm.

Next, the surface of the interlayer insulating film 68 is polished and flattened by, for example, a CMP method. Thereafter, a heat treatment is conducted in a plasma atmosphere generated by use of, for example, $N_2O$ gas or $N_2$ gas at a temperature of 350° C. for 2 minutes. The heat treatment is intended to remove water in the interlayer insulating film 68, and to change the film quality of the interlayer insulating film 68. After the heat treatment, the interlayer insulating film 68 is more resistant to entry of water.

Next, a step of obtaining the structure of FIG. 10Q is described. After the formation of the interlayer insulating film 68 in the above-described step, a protection film 70 having a thickness of 20 nm to 50 nm is formed on the interlayer insulating film 68 by, for example, a sputtering method or a CVD method. The protection film 70 is formed of an insulating material such as AlOx.

Next, an interlayer insulating film 72 having a thickness of about 300 nm and made of an insulating material such as $SiO_2$ is formed on the protection film 70 by, for example, a plasma TEOS CVD method.

Next, a step of obtaining the structure of FIG. 10R is described. After the formation of the interlayer insulating film 72 in the above-described step, a contact hole 74a and a contact hole 74b are formed by employing a photolithography method and a etching method. The contact hole 74a extends from the top surface of the interlayer insulating film 72 to the lower electrode 48, and the contact hole 74b extends from the top surface of the interlayer insulating film 72 to the upper electrode 60.

Thereafter, a heat treatment is conducted, for example, in an oxygen atmosphere at a temperature of 400° C. to 600° C. for 30 minutes to 120 minutes. The heat treatment is intended to supply oxygen to the dielectric film 50, and to thereby improve the electrical characteristics of the ferroelectric capacitor 62.

Next, a step of obtaining the structure in FIG. 10S is described. After the heat treatment conducted in the above-described step, a contact hole 76 extending from the top surface of the interlayer insulating film 72 to the conductive plug 36 is formed by use of a photolithography method and an etching method.

Next, a step of obtaining the structure in FIG. 10T is described. After the formation of the contact hole 76 in the above-described step, an adhesion layer 78 is formed on the entire top surface of the semiconductor substrate 10 by, for example, a sputtering method. Thus, inner surfaces of the contact holes 74a, 74b, and 76 are covered with the adhesion layer 78.

The adhesion layer 78 is formed of, for example, TiN, and has a thickness of, for example, 50 nm to 150 nm. When a TiN film is formed as the adhesion layer 78, Ti is used as a target. In addition, the atmosphere in the film formation chamber is an atmosphere of a mixture of Ar gas and $N_2$ gas. The flow rate of the Ar gas is, for example, 50 sccm, and the flow rate of the $N_2$ gas is, for example, 90 sccm. The film formation temperature is, for example, 150° C.

Next, a conductive material such as W (tungsten) is deposited on the entire top surface of the semiconductor substrate 10 by, for example, a CVD method. Thus, the conductive material is filled into the contact holes 74a, 74b, and 76. Thereafter, the conductive material and the adhesion layer 78 on the interlayer insulating film 72 are polished and removed by, for example, a CMP method to an extent that the surface of the interlayer insulating film 72 is exposed. Thus, a conductive plug 80a, a conductive plug 80b, and a conductive plug 80c are formed. The conductive plug 80a is electrically connected to the lower electrode 48, the conductive plug 80b is electrically connected to the upper electrode 60, and the conductive plug 80c is electrically connected to the transistor 26 through the conductive plug 36.

Next, a step of obtaining the structure in FIG. 10U is described. After the formation of the conductive plugs 80a, 80b, and 80c in the above-described step, the semiconductor substrate 10 is subjected to plasma cleaning. A gas used for the plasma cleaning is, for example, Ar gas. As a result, natural oxidation films and the like present on the surfaces of the conductive plugs 80a to 80c are removed.

Next, a TiN film 82, an Al Cu alloy film 84, a Ti film 86, and a TiN film 88 are sequentially formed on the entire top surface of the semiconductor substrate 10 by, for example, a sputtering method. In this case, the TiN film 82 has a thickness of 50 nm, the Al Cu alloy film 84 has a thickness of 550 nm, the Ti film 86 has a thickness of 5 nm, and the TiN film 88 has a thickness of 50 nm, for example.

Next, the TiN film 82, the AlCu alloy film 84, the Ti film 86, and the TiN film 88 are patterned by conducting a photolithography process and an etching process. Thus, wirings 90 are formed. Each of the wirings 90 has a structure in which the TiN film 82, the Al Cu alloy film 84, the Ti film 86, and the TiN film 88 are staked. Note that the material and the layer structure of the wiring 90 may be changed as appropriate.

Subsequently, interlayer insulating films, conductive plugs, wirings, and the like are further formed, if necessary, to obtain a multilayer wiring structure. A semiconductor device according to the first embodiment is thus completed.

Note that the case where the conductive oxide film 52 is formed by sputtering the ferroelectric material to which Ir is added is described in the first embodiment. However, the conductive oxide film 52 may be formed by first forming a non-crystalline (amorphous) dielectric film, and then introducing a metal element such as Ir or Ru into the dielectric film.

For example, an amorphous dielectric film having a thickness of 10 nm to 30 nm and having the same composition as the dielectric film 50 is formed on the crystallized dielectric film 50. Thereafter, an IrOx film (conductive film 56) is formed on the amorphous dielectric film. Then, a heat treatment (RTA) is conducted to diffuse Ir contained in the IrOx film into the amorphous dielectric film. Thus, the conductive oxide film 52 is formed.

In this method, the film formation temperature of the IrOx film influences the characteristics of the ferroelectric capacitor. If the film formation temperature is 200° C. or above, the IrOx film is crystallized simultaneously with the film formation, and Ir is diffused into the amorphous dielectric film. Then, when the amorphous dielectric film is crystallized, Ir diffused in the amorphous dielectric film is incorporated into the crystals. As a result, a conductive oxide film 52 having the same crystal structure as the dielectric film 50 is formed.

In this case, since the IrOx film (conductive film 56) is already crystallized, Pb in the amorphous dielectric film is hard to diffuse into the IrOx film. As a result, no paraelectric layer is formed between the IrOx film (conductive film 56) and the conductive oxide film 52.

On the other hand, when the film formation temperature of the IrOx film is lower than 200° C., Ir hardly diffuses from the IrOx film to the amorphous dielectric film during the film formation. In addition, when the amorphous dielectric film is crystallized, interdiffusion of 1r and Pb occurs between the IrOx film (conductive film 56) and the amorphous dielectric film, so that a paraelectric layer is formed at an interface between the IrOx film (conductive film 56) and the dielectric film (the film formed after crystallization of the amorphous dielectric film).

For this reason, when the conductive oxide film 52 is formed by the above-described method, the film formation temperature of the IrOx film (conductive film 56) is preferably 200° C. or above.

Figure 11A:
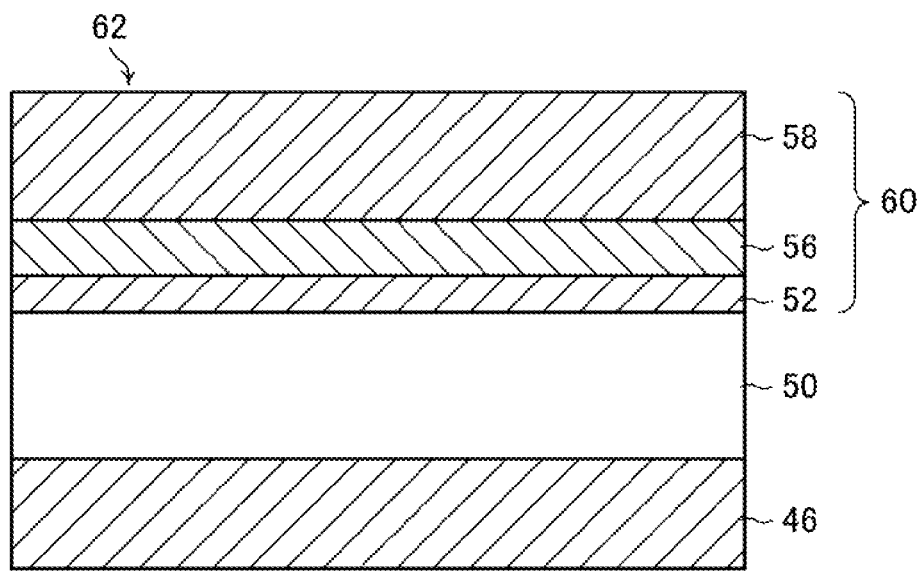
FIG. 11A is a cross-sectional view illustrating a ferroelectric capacitor of the first embodiment.
Figure 11B:
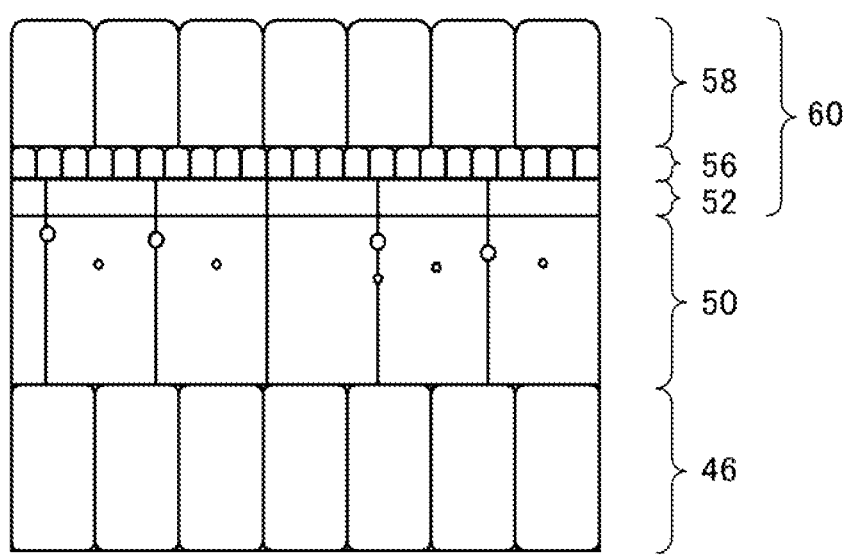
FIG. 11B is a diagram schematically illustrating a layer structure of the same ferroelectric capacitor.

FIG. 11A is a cross-sectional view of a ferroelectric capacitor 62 formed by the above-described method on the semiconductor substrate 10, and FIG. 11B is a diagram schematically illustrating a layer structure of the ferroelectric capacitor 62.

As illustrated in FIG. 11A, the ferroelectric capacitor 62 of a semiconductor device according to the first embodiment has a noble metal film 46 (lower electrode), a dielectric film 50, and an upper electrode 60. The upper electrode 60 has a layered structure of a conductive oxide film 52, a conductive film 56, and a conductive film 58.

As illustrated in FIG. 11B, Pt forming the noble metal film 46 has a columnar crystal structure, and PZT (perovskite crystal) forming the dielectric film 50 grows on the crystals of the noble metal film 46. Then, PZT forming the conductive oxide film 52 also grows while succeeding to the crystallinity of the dielectric film 50 to have a columnar perovskite structure.

Ir added to the conductive oxide film 52 is incorporated into the crystals, and Ir is hardly present at the grain boundaries. Moreover, the Ir percentage content in the conductive oxide film 52 is as small as about 1 mol % to 4 mol %. For this reason, even when a heat treatment is conducted, the amount of 1r diffused from the conductive oxide film 52 to the dielectric film 50 is small, and no paraelectric layer (dead layer) is formed at the interface between the upper electrode 60 and the dielectric film 50. If the paraelectric layer is formed, the film thickness thereof is small. Note that interdiffusion between Pb in the dielectric film 50 and Pb in the conductive oxide film 52 may possibly occur, but the interdiffusion between Pb and Pd does not results in the formation of the paraelectric layer.

Hereinafter, description is made of results obtained when the Ir concentration distribution near the interface between a dielectric film and an upper electrode is measured by use of a secondary ion mass spectrometer (SIMS).

First, a capacitor having the structure of FIGS. 11A and 11B is produced as Example. Specifically, a PZT film (dielectric film 50) having a thickness of 130 nm is formed on a Pt film (noble metal film 46), and is subjected to a crystallization treatment (heat treatment). Thereafter, an amorphous PZT film having a thickness of 20 nm is formed on the PZT film, and an $IrO_2$ film (conductive film 56) is formed on the amorphous PZT film. The temperature during the formation of the $IrO_2$ film is 300° C., so that Ir is diffused into the amorphous PZT film simultaneously with the formation of the $IrO_2$ film.

Subsequently, a heat treatment is conducted in an atmosphere of a mixture of Ar and $O_2$ at a temperature of 725° C. Thus, the amorphous PZT is crystallized to form a conductive oxide film 52 (PZT(Ir) film).

On the other hand, a capacitor having the structure of FIGS. 1A and 1B is formed as Comparative Example 1, and a capacitor having the structure of FIGS. 5A and 5B is formed as Comparative Example 2. The methods for forming Pt films (lower electrode films 211 and 221), PZT films (dielectric films 212, 222, and 223), and IrO$_2$ films (electrode films 213 and 224) are basically the same as those in the above-described Example. The thickness of the PZT film of Comparative Example 1 is 150 nm. The thickness of the first PZT film of Comparative Example 2 is 130 nm, and the thickness of the second PZT film is 20 nm.

Figure 12A:
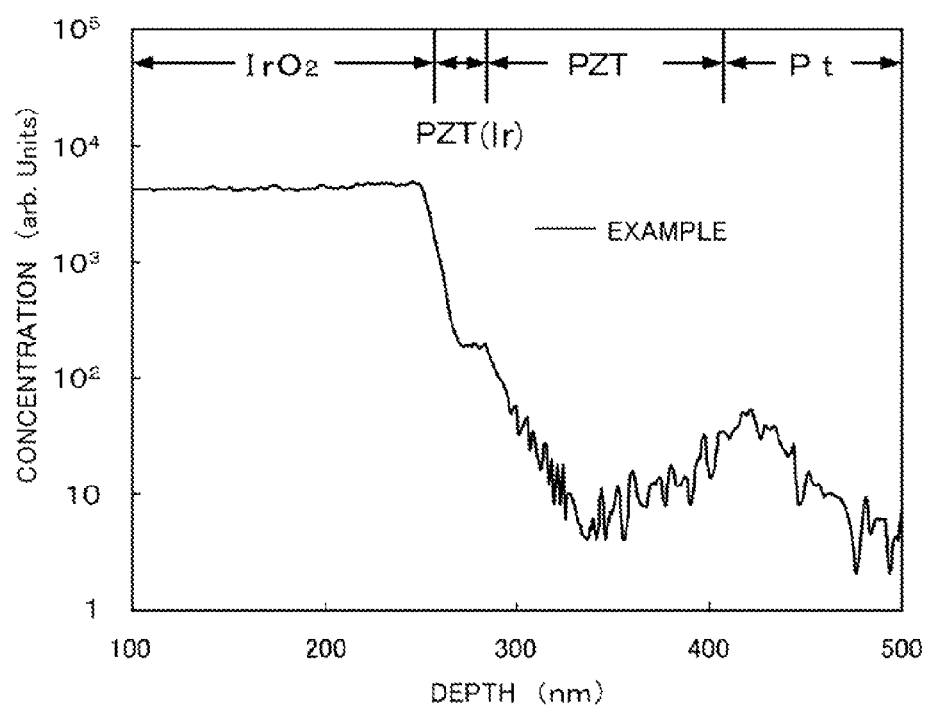
FIG. 12A is a diagram illustrating an example of results obtained by investigating the Ir concentration distribution in a ferroelectric capacitor of Example.
Figure 12B:
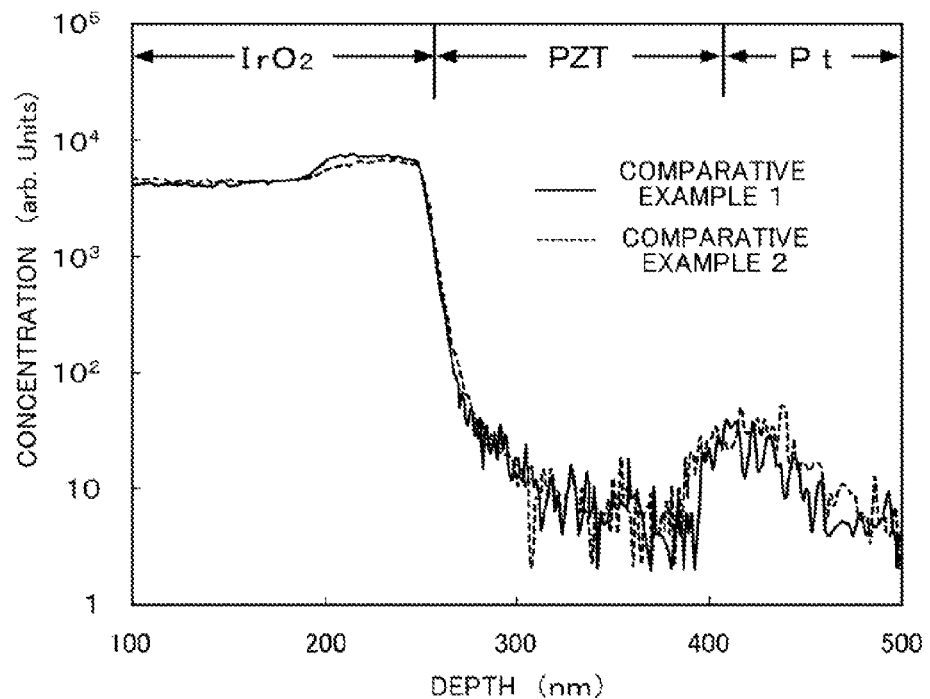
FIG. 12B is a diagram illustrating an example of results obtained by investigating the Ir concentration distribution in ferroelectric capacitors of Comparative Examples 1 and 2.

FIG. 12A is a diagram illustrating an example of results obtained by investigating the Ir concentration distribution in the ferroelectric capacitor of Example. In FIG. 12A, the horizontal axis represents the depth, and the vertical axis represents the concentration. Meanwhile, FIG. 12B is a diagram illustrating an example of results obtained by investigating the Ir concentration distribution of the ferroelectric capacitor of each of Comparative Examples 1 and 2. In FIG. 12B, the horizontal axis represents the depth, and the vertical axis represents the concentration. Note that, in Example, the interface between the PZT(Ir) film and the PZT film is the interface between the upper electrode and the dielectric film, whereas, in each of Comparative Examples 1 and 2, the interface between the IrO$_2$ film and the PZT film is the interface between the upper electrode and the dielectric film.

It is understood from FIGS. 12A and 12B that the Ir concentration near the interface between the upper electrode and the dielectric film is lower in the ferroelectric capacitor of Example than in each of the ferroelectric capacitors of Comparative Examples 1 and 2 by one order of magnitude or more.

Figure 13:
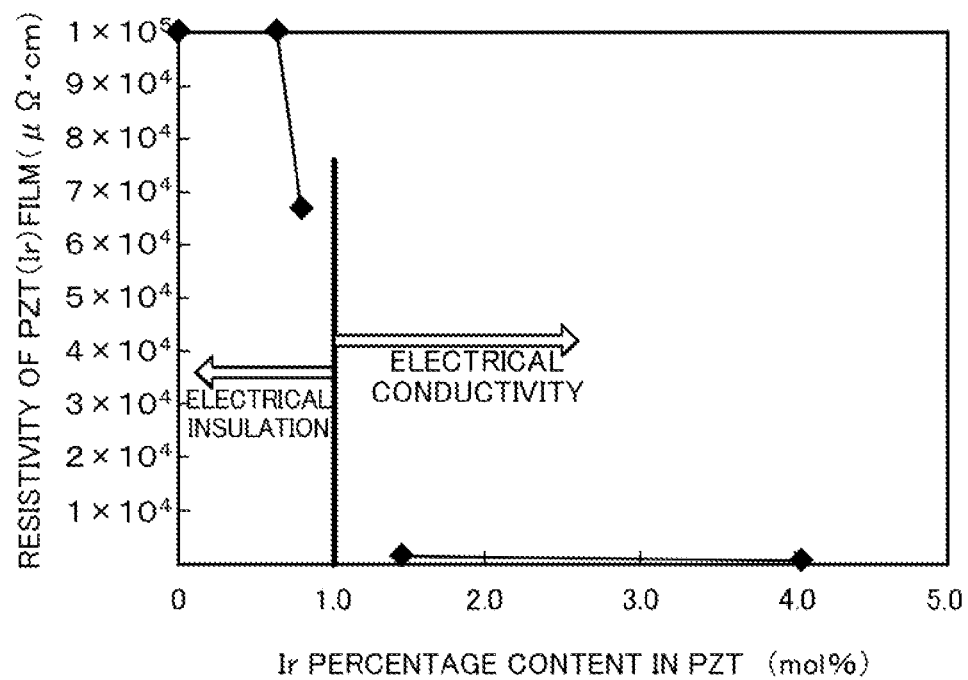
FIG. 13 is a diagram illustrating an example of results obtained by investigating the Ir percentage content and the resistivity.

FIG. 13 is a diagram illustrating an example of results obtained by investigating the relationship between the Ir percentage content and the resistivity. In FIG. 13, the horizontal axis represents the Ir percentage content in PZT, and the vertical axis represents the resistivity. When the Ir percentage content in the PZT is 0.6 mol % or less, the resistivity is large, and the PZT exhibits electrical insulation characteristics. When the Ir percentage content in the PZT is 0.8 mol %, the resistivity is measurable, but the resistivity is so large that the PZT is not usable as an electrode.

When the Ir percentage content is 1.0 mol % or more, the resistivity is so small that the PZT is usable as an electrode. Moreover, when the Ir percentage content is not less than 2.0 mol %, the PZT exhibits a favorable electrical conductivity. It is understood from FIG. 13 that the Ir percentage content of the conductive oxide film 52 may be 1 mol % or more, and more preferably 2 mol % or more.

Figure 14:
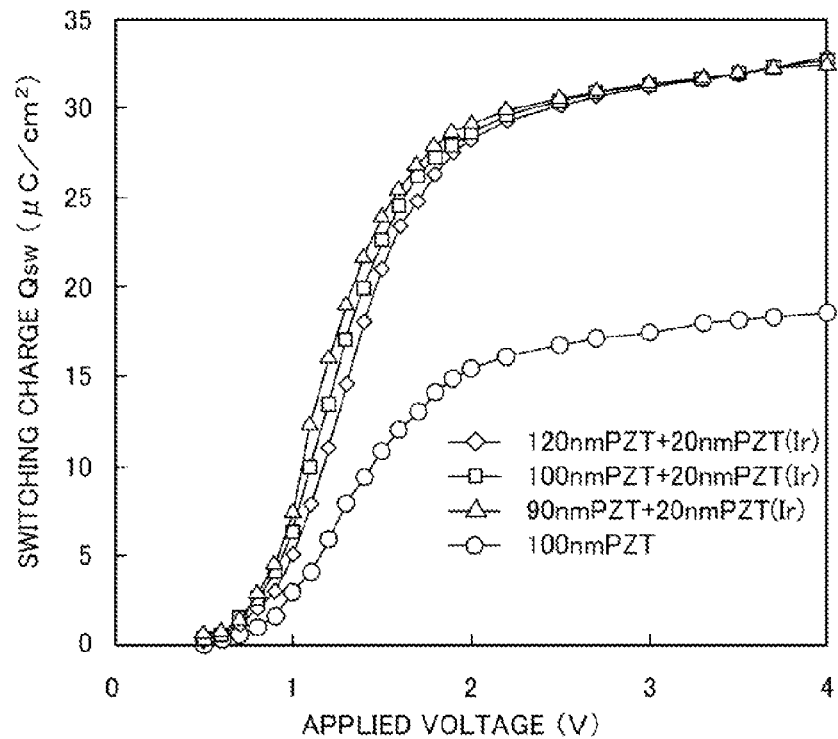
FIG. 14 is a graph illustrating an example of the relationship between the switching charge Qsw and the applied voltage V (Qtv characteristics) of ferroelectric capacitors of Examples with various film thicknesses.

FIG. 14 is a graph illustrating an example of the relationship between the switching charge Qsw and the applied voltage (Qtv characteristics) of the ferroelectric capacitors of Examples where the film thickness of the dielectric films (PZT film) are 90 nm, 100 nm, and 120 nm, respectively. In FIG. 14, the horizontal axis represents the applied voltage, and the vertical axis represents the switching charge Qsw. Note that the thickness of the conductive oxide film (PZT(Ir) film) of each of these ferroelectric capacitors is 20 nm.

Figure 15:
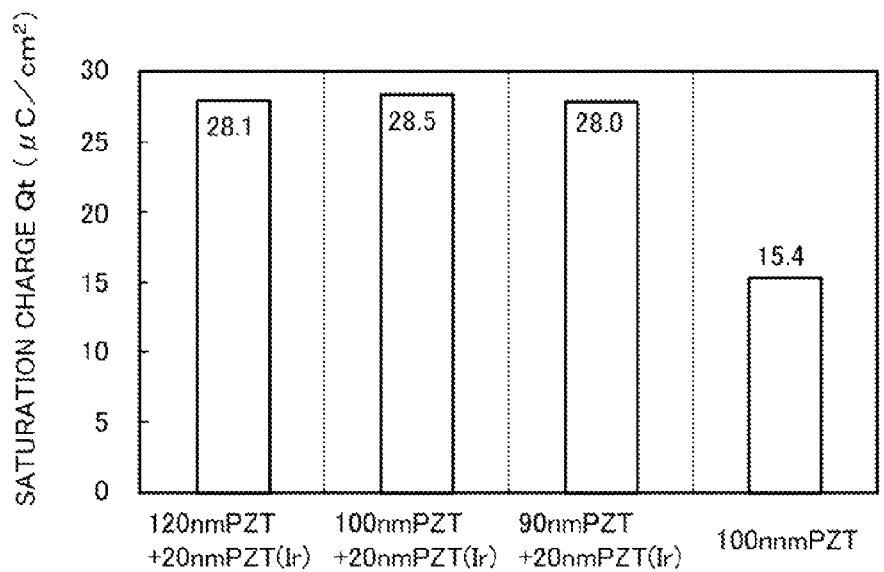
FIG. 15 is a diagram illustrating an example of the saturation charge Qt of each of the ferroelectric capacitors in FIG. 14.
Figure 16:
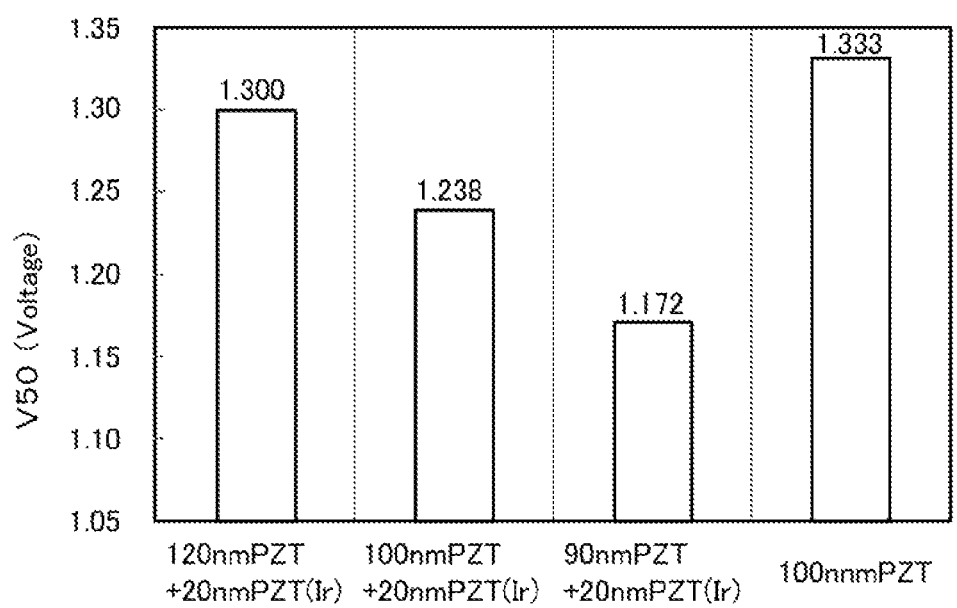
FIG. 16 is a diagram illustrating an example of the V50 of each of the ferroelectric capacitors in FIG. 14.

Meanwhile, FIG. 15 is a diagram illustrating an example of the saturation charge Qt of each of these ferroelectric capacitors. FIG. 16 is a diagram illustrating an example of the V50 of each of these ferroelectric capacitors.

Note that FIGS. 14 to 16 also illustrate the Qtv characteristics, the saturation charge Qt, and the V50 of a ferroelectric capacitor having the structure of FIGS. 1A and 1B as a comparative example. The film thickness of the dielectric film (PZT film) of the ferroelectric capacitor of the comparative example is 100 nm.

As understood from FIG. 14, even when the film thickness of the dielectric film (PZT film) is changed among the ferroelectric capacitors of Examples, almost no change is observed in the curve (Qtv characteristics) representing the relationship between the switching charge Qsw and the applied voltage V. Moreover, as understood from FIG. 15, the value of the saturation charge Qt is almost constant among the ferroelectric capacitors of Examples, irrespective of the film thickness of the dielectric film (PZT). Moreover, as understood from FIG. 16, as the thickness of the dielectric film (PZT film) becomes smaller, the value of V50 becomes smaller, in the case of the ferroelectric capacitors of Examples. It is understood from these results that each of the ferroelectric capacitors of Examples is improved in terms of the interface between the dielectric film and the upper electrode when compared with the ferroelectric capacitor of the comparative example.

Moreover, in the cases of the ferroelectric capacitors of Examples, the Qtv characteristics hardly change even when the film thickness of the dielectric film is reduced. From this result, it is understood that desired characteristics may be obtained by a ferroelectric capacitors of Example, even when the film thickness of the dielectric film is reduced. Moreover, in the case of the ferroelectric capacitors of Examples, the value of the V50 is reduced as the ferroelectric film is made thinner. From this result, it is understood that each of the ferroelectric capacitors of Examples may be operated at a low voltage by making the film thickness of the dielectric film smaller.

Figure 17:
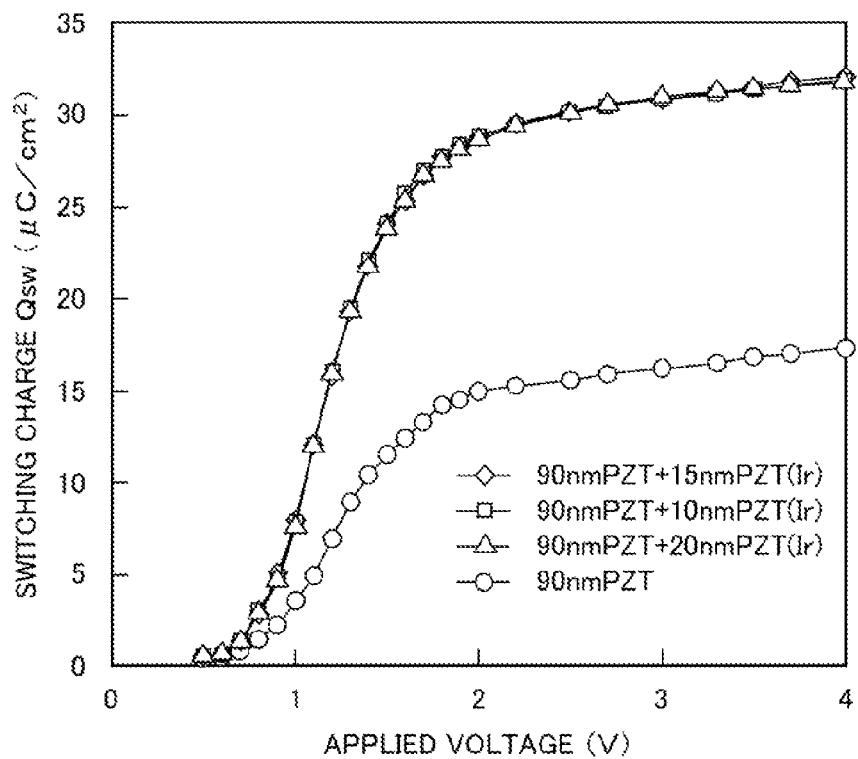
FIG. 17 is a diagram illustrating an example of the relationship between the switching charge Qsw and the applied voltage V (Qtv characteristics) of ferroelectric capacitors of Examples having conductive oxide films with various film thicknesses.

FIG. 17 is a diagram illustrating an example of the relationship between the switching charge Qsw and the applied voltage V (Qtv characteristics) of the ferroelectric capacitors of Examples where the film thicknesses of the conductive oxide films (PZT(Ir) films) are 10 nm, 15 nm, and nm, respectively. In FIG. 17, the horizontal axis represents the applied voltage, and the vertical axis represents the switching charge Qsw. Note however that the film thickness of the dielectric film (PZT film) of each of these ferroelectric capacitors is 90 nm.

Figure 18:
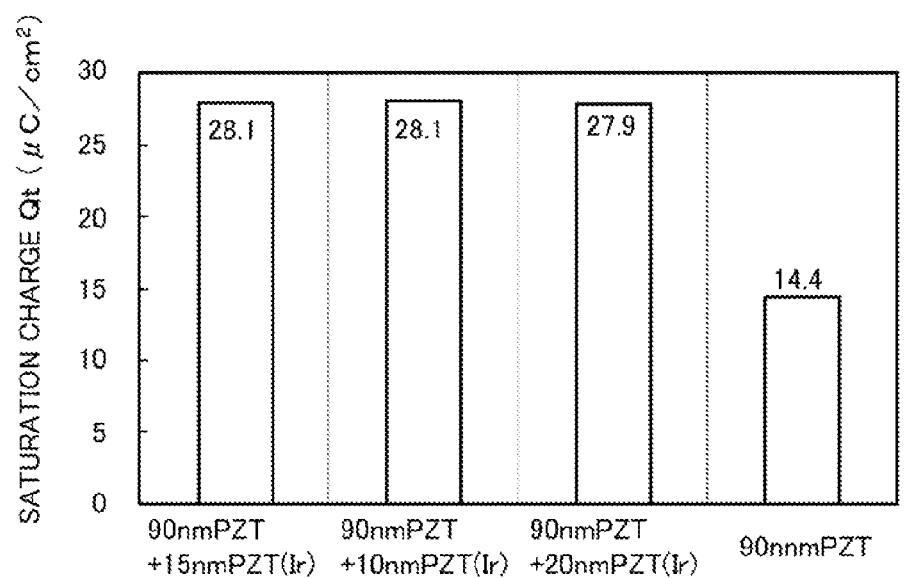
FIG. 18 is a diagram illustrating an example of the saturation charge Qt of each of the ferroelectric capacitors in FIG. 17.
Figure 19:
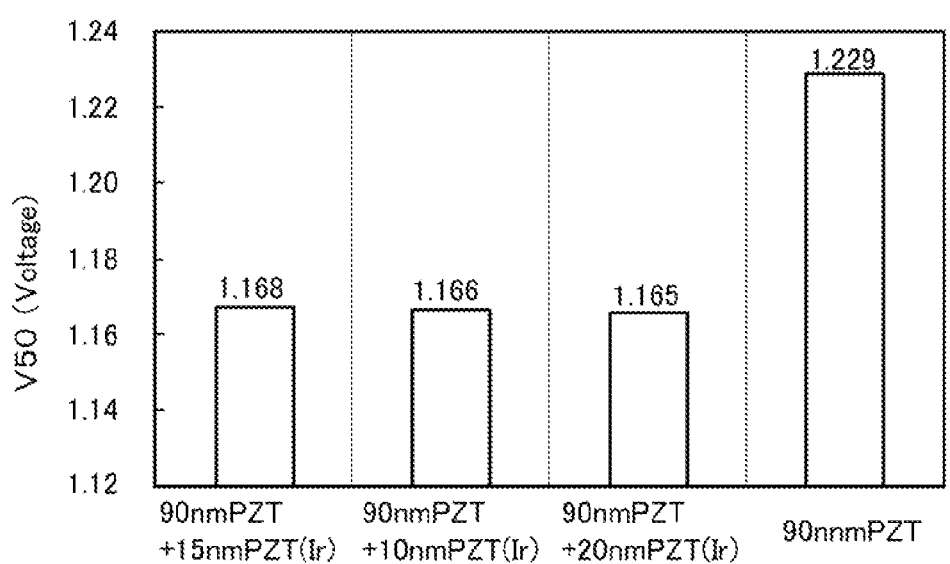
FIG. 19 is a diagram illustrating an example of the V50 of each of the ferroelectric capacitors in FIG. 17.

Meanwhile, FIG. 18 is a diagram illustrating an example of the saturation charge Qt of each of these ferroelectric capacitors, and FIG. 19 is a diagram illustrating an example of the V50 of each of these ferroelectric capacitors.

Note that FIG. 17 to FIG. 19 also illustrate the Qtv characteristics, the saturation charge Qt, and the V50 of a ferroelectric capacitor having the structure of FIGS. 1A and 1B as a comparative example. The film thickness of the dielectric film (PZT film) of the ferroelectric capacitor of the comparative examples is 90 nm.

As seen from FIG. 17, in the case of the ferroelectric capacitors of Examples, the curve (Qtv characteristics) representing the relationship between the switching charge Qtv and the applied voltage V hardly changes, even when the film thickness of the conductive oxide film (PZT(Ir) film) is changed. Moreover, as understood from FIGS. 18 and 19, the values of the saturation charge Qt and the V50 are almost constant among the ferroelectric capacitors of Examples, irrespective of the film thickness of the conductive oxide film (PZT(Ir) film). From there results, it is understood that, in the case of the ferroelectric capacitors of Examples, the film thickness of the conductive oxide film does not greatly influence the characteristics of the ferroelectric capacitors.

Figure 20:
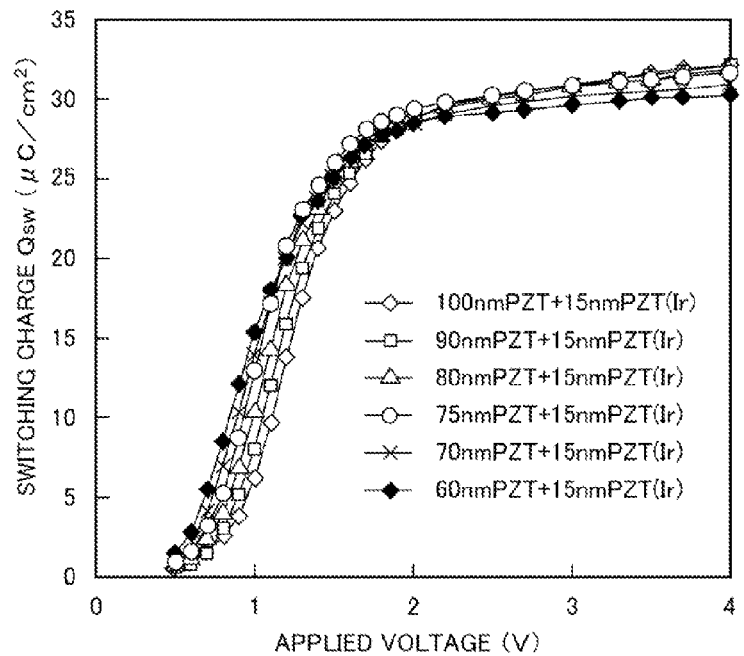
FIG. 20 is a graph illustrating an example of the relationship between the switching charge Qsw and the applied voltage V (Qtv characteristics) of ferroelectric capacitors of Examples having dielectric films with various film thicknesses.

FIG. 20 is a graph illustrating an example of the relationship between the switching charge Qsw and the applied voltage V (Qtv characteristics) of the ferroelectric capacitors of Examples among which the film thickness of the dielectric film (PZT film) is changed in the range from 60 nm to 100 nm. In FIG. 20, the horizontal axis represents the applied voltage, and the vertical axis represents the switching charge Qsw.

Note that the thickness of the conductive oxide film (PZT(Ir) film) of each of these ferroelectric capacitors is 15 nm.

Figure 21:
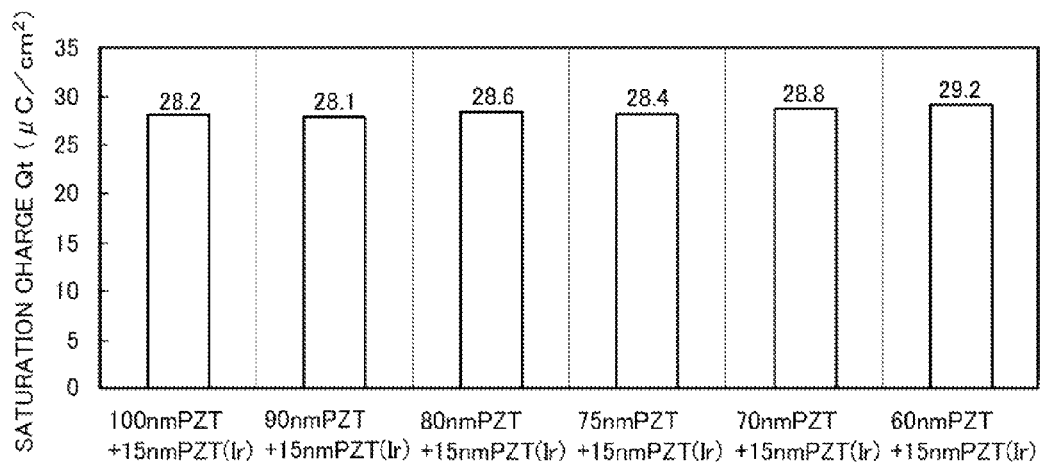
FIG. 21 is a diagram illustrating an example of the saturation charge Qt of each of the ferroelectric capacitors in FIG. 20.
Figure 22:
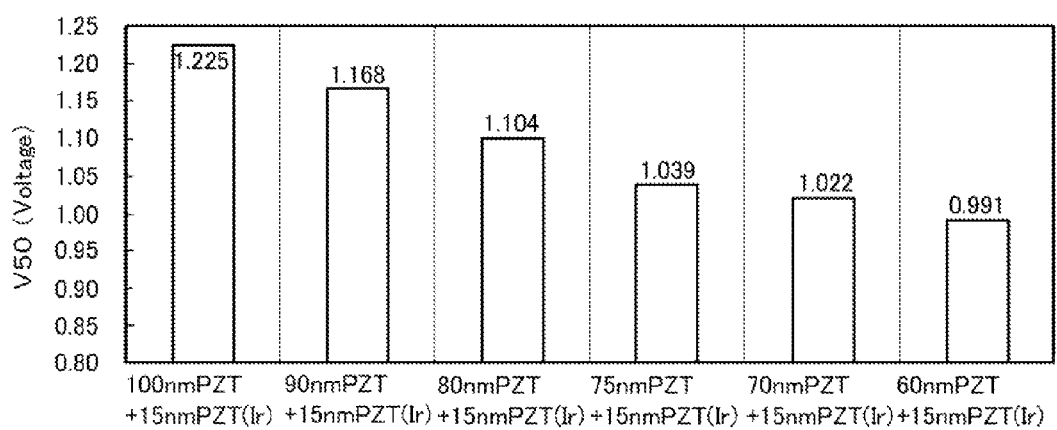
FIG. 22 is a diagram illustrating an example of the V50 of each of the ferroelectric capacitors in FIG. 20.

Moreover, FIG. 21 is a diagram illustrating an example of the saturation charge Qt of each of these ferroelectric capacitors, and FIG. 22 is a diagram illustrating an example of the V50 of each of these ferroelectric capacitors.

From FIGS. 20 to 22, it is understood that, in the case of the ferroelectric capacitors of Examples, the switching charge Qsw and the saturation charge Qt hardly change, even when the film thickness of the dielectric film (PZT film) is reduced to 60 nm. Moreover, in the case of the ferroelectric capacitors of Examples, the value of the V50 becomes smaller as the dielectric film (PZT film) becomes thinner.

In each of the ferroelectric capacitors of Examples, the conductive oxide film 52 having a perovskite structure is formed on the dielectric film 50. This improves the interface between the upper electrode 60 and the dielectric film 50, and a paraelectric layer is hardly formed between the upper electrode 60 and the dielectric film 50. Accordingly, a large saturation charge Qt may be obtained even when the film thickness of the dielectric film 50 is reduced, and hence the ferroelectric capacitor may be operated at a low voltage.

Figure 23:
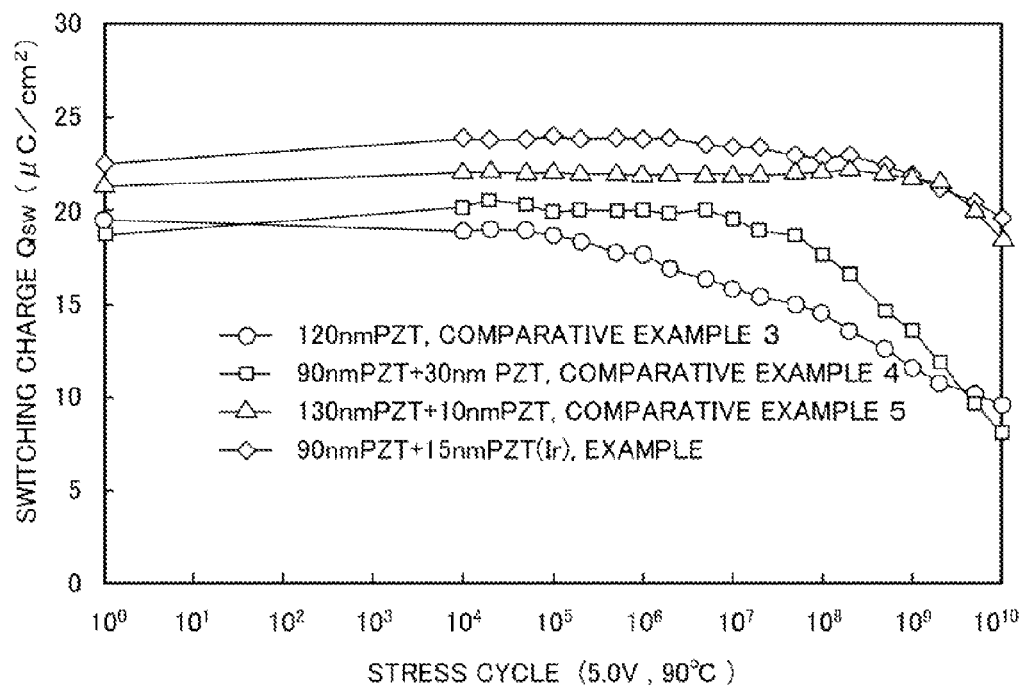
FIG. 23 is a graph illustrating an example of results obtained when ferroelectric capacitors of Example and Comparative Examples are subjected to a stress test.

FIG. 23 is a graph illustrating an example of results obtained when a ferroelectric capacitor of Example is subjected to a stress test in which data are repeatedly written and deleted in an atmosphere at 90° C. In FIG. 23, the horizontal axis represents the stress cycle, and the vertical axis represents the switching charge Qsw. Note that, in the ferroelectric capacitor of Example, the film thickness of the dielectric film (PZT film) is 90 nm, and the film thickness of the conductive oxide film (PZT(Ir) film) is 15 nm. In addition, the voltage supplied to the ferroelectric capacitor during the stress test is 5 V, and the voltage supplied to the ferroelectric capacitor for the measurement of the switching charge Qsw is 1.8 V.

Moreover, a ferroelectric capacitor having the structure of FIGS. 1A and 1B is produced as Comparative Example 3, and ferroelectric capacitors having the structure of FIGS. 5A and 5B are produced as Comparative Examples 4 and 5. These ferroelectric capacitors are also subjected to the stress test. The thickness of the dielectric film (PZT film) in the ferroelectric capacitor of Comparative Example 3 is 120 nm, the film thickness of the dielectric film in the ferroelectric capacitor of Comparative Example 4 is 120 nm (90 nm+30 nm), and the film thickness of the dielectric film in the ferroelectric capacitor of Comparative Example 5 is 140 nm (130 nm+10 nm).

Figure 24:
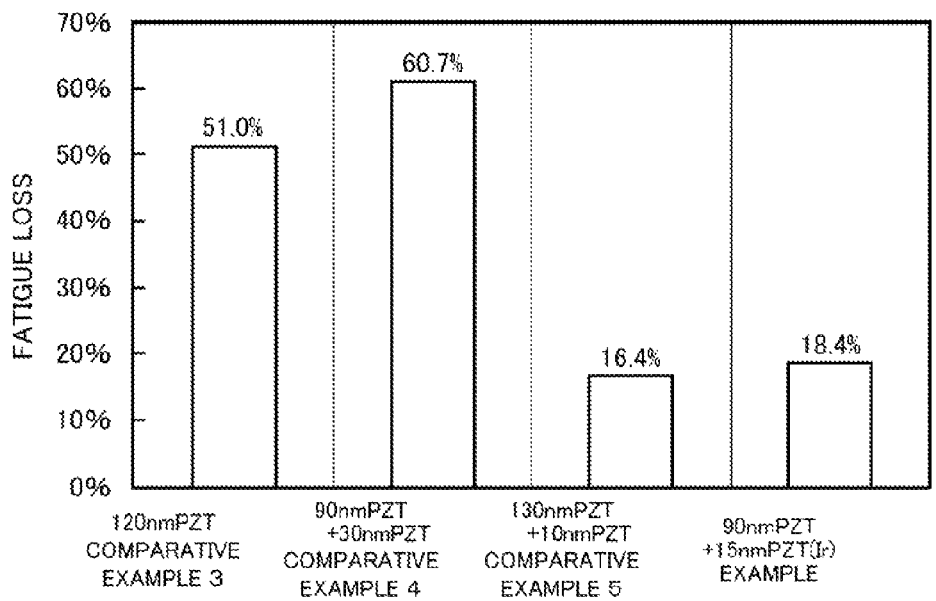
FIG. 24 is a diagram illustrating an example of the fatigue loss of the ferroelectric capacitors of Example and Comparative Examples.

Moreover, FIG. 24 is a diagram illustrating an example of fatigue loss of the ferroelectric capacitors of Example and Comparative Examples 3 to 5. The fatigue loss is calculated by 100×((Qsw1−Qsw2)/Qsw1), where Qsw1 represents the initial value of the switching charge Qsw of a ferroelectric capacitor, and Qsw2 represents the switching charge of the ferroelectric capacitor subjected to $10^{10}$ cycles in the cycle test illustrated in FIG. 23. A smaller value of the fatigue loss indicates that the ferroelectric capacitor is more resistant to degradation.

As understood from FIGS. 23 and 24, the fatigue resistance characteristics of the ferroelectric capacitor of Example are better than those of the ferroelectric capacitors of Comparative Examples 3 and 4. Although the film thickness of the dielectric film (PZT film) in the ferroelectric capacitor of Example is as thin as 90 nm, the ferroelectric capacitor of Example has fatigue resistance characteristics almost equivalent to those of the ferroelectric capacitor of Comparative Example 5 where the film thickness of the dielectric film is 140 nm.

Second Embodiment

Figure 25:
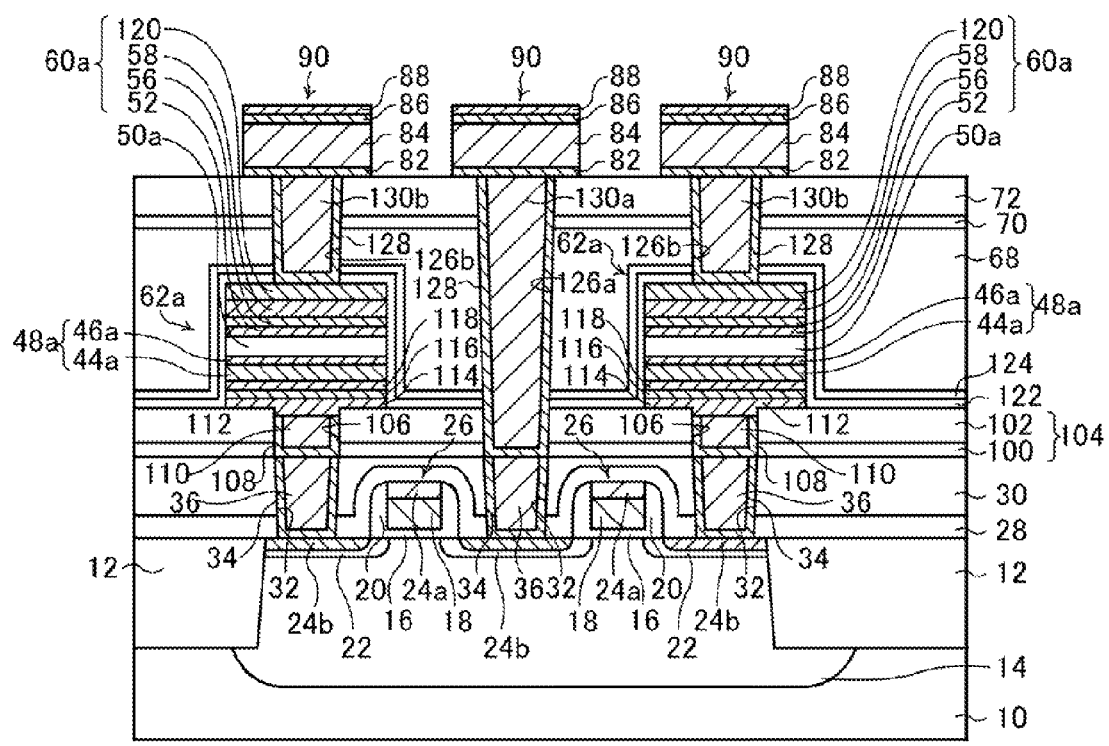
FIG. 25 is a view for describing a semiconductor device according to a second embodiment, and a method of manufacturing the semiconductor device.

FIG. 25 is a view for describing a semiconductor device and a manufacturing method thereof according to a second embodiment. The second embodiment is described while a stack-type FeRAM is taken as an example.

First, as in the case of the first embodiment, an element isolation film 12 and a well 14 are formed in a semiconductor substrate (silicon substrate) 10, and source and drain regions 22, gate insulating films 16, and gate electrodes 18 of transistors 26 are formed. In addition, side walls 20 are formed on the sides of the gate electrode 18, a silicide film 24a is formed on the gate electrode 18, and a silicide film 24b is formed on the surface of each of the source and drain regions 22. Note that the second embodiment is different from the first embodiment in that two transistors 26 are formed in one well 14.

Next, an insulating film 28 and an interlayer insulating film 30 are sequentially formed on the entire top surface of the semiconductor substrate 10. Then, contact holes 32 are formed which extend from the top surface of the interlayer insulating film 30 to the silicide film 24b. Thereafter, an adhesion layer 34 is formed in each of the contact holes 32, and a high-melting-point metal such as W (tungsten) is filled into the contact holes 32 to form conductive plugs 36.

Next, a SiNO film 100 having a thickness of, for example, 130 nm is formed by a plasma CVD method on the entire top surface of the semiconductor substrate 10, and then a $SiO_2$ film 102 having a thickness of 300 nm is further formed on the SiNO film 100. Thus, an interlayer insulating film 104 having a double layered structure is formed.

Thereafter, contact holes 106 are formed which extend from the top surface of the interlayer insulating film 104 to the conductive plugs 36, and then the wall surface of each of the contact holes 106 is covered with an adhesion layer 108. The adhesion layer 108 has, for example, a double layered structure of a Ti film having a thickness of 30 nm and a TiN film having a thickness of 20 nm. Then, a high-melting-point metal such as W (tungsten) is filled into the contact holes 106 to form conductive plugs 110.

Next, a Ti film having a thickness of 100 nm to 300 nm is formed on the entire top surface of the semiconductor substrate 10, for example, by a sputtering method. Then, the semiconductor substrate 10 is subjected to a heat treatment (RTA) in a nitrogen atmosphere, for example, at a temperature of 650° C. for 60 seconds. The heat treatment converts the Ti film into a TiN film. The TiN film is used as an underlayer film 114.

Next, the surface of the underlayer film 114 is polished by a CMP method to a film thickness of 50 nm to 100 nm. Thereafter, the surface of the underlayer film 114 is treated with plasma. Specifically, the surface of the underlayer film 114 is exposed to a plasma atmosphere generated by use of, for example, $NH_3$ gas.

Next, a Ti film having a thickness of 20 nm is formed on the underlayer film 114 by, for example, a sputtering method. Since the Ti film is formed on the plasma-treated underlayer film 114, a Ti film with high film quality may be obtained in the second embodiment.

Next, a heat treatment (RTA) is conducted in a nitrogen atmosphere, for example, at a temperature of 650° C. for 60 seconds. Thus, the Ti film is converted into a TiN film with the (111) orientation, and used as an adhesion layer 116.

Next, a TiAlN film having a thickness of about 10 nm is formed on the adhesion layer 116 by, for example, a reactive sputtering method, and used as an oxygen barrier film (oxygen diffusion prevention film) 118. The oxygen barrier film 118 is intended to prevent oxidation of the top surface of each of the conductive plugs 110.

Next, a noble metal film (conductive film) 44a made of a noble metal such as Ir and having a thickness of about 100 nm is formed on the oxygen barrier layer 118 by, for example, a sputtering method. Thereafter, a heat treatment (RTA) is conducted, for example, in an argon atmosphere at a temperature of 650° C. for 60 seconds. The heat treatment is intended to grow crystal grains of the noble metal with a uniform size in the noble metal film 44a.

Next, IrOx (iridium oxide) is deposited on the noble metal film 44a to a thickness of 25 nm by, for example, a sputtering method. Thus, an amorphous noble metal oxide film is formed. The noble metal oxide film is to be reduced into a noble metal film 46a in a later stage.

Next, a dielectric film 50a made of a ferroelectric material such as PZT is formed on the noble metal oxide film by, for example, a MOCVD method. The thickness of the dielectric film 50a is preferably 30 nm to 150 nm, and more preferably 50 nm to 120 nm.

Next, a conductive oxide film 52 is formed on the dielectric film 50a by, for example, a sputtering method. As in the case of the first embodiment, the conductive oxide film 52 may be formed by, for example, a high-frequency sputtering method using a target of a ferroelectric material to which a conductive material such as Ir or Ru is added.

Next, the semiconductor substrate 10 is subjected to a heat treatment (RTA) in an atmosphere containing oxygen. The heat treatment is intended to further improve the crystallinity of the dielectric film 50a, and to crystallize the amorphous conductive oxide film 52 continuously on the dielectric film 50a. In this heat treatment, the growth of the crystals of the conductive oxide film 52 starts from crystal grains of the dielectric film 50a. Moreover, the conductive oxide film 52 suppresses the interdiffusion of metal elements between the dielectric film 50a and a conductive film 56.

Next, a conductive film 56 having a thickness of 20 nm to 50 nm is formed on the conductive oxide film 52 by, for example, a sputtering method. Thereafter, a conductive film 58 having a thickness of 75 nm to 200 nm is formed on the conductive film 56 by a sputtering method or the like. These conductive films 56 and 58 are formed of, for example, IrOx.

Next, an Ir film having a thickness of about 50 nm is formed on the conductive film 58 by, for example, a sputtering method. Thus, a hydrogen barrier film 120 is formed. Note that the hydrogen barrier film 120 has conductivity and a property of not easily allowing hydrogen permeation, and may be formed of, for example, $SrRuO_3$ or the like.

Next, a TiN film is formed on a hydrogen barrier film 120 by, for example, a sputtering method. Thus, a first protection film (not illustrated) is formed. Note that, the first protection film may be formed by a TiAlN film, a Ta film, an AlN film, a TaN film, or a layered film of any of them.

Next, a second protection film (not illustrated) is formed on the first protection film by, for example, a plasma TEOS CVD method. Thereafter, a photoresist film is formed on the second protection film. Then, an exposure process and a development process are conducted to leave the photoresist film in predetermined regions. Then, the second protection film is etched by using the photoresist film as a mask. Thereafter, the photoresist film is removed, and then the first protection film is etched by using the second protection film as a mask. Thus, a hard mask having a double layered structure including the first protection film and the second protection film is obtained.

Next, portions of the hydrogen barrier film 120, the conductive film 58, the conductive film 56, the conductive oxide film 52, the dielectric film 50a, the noble metal film 46a, and the conductive film 44a located in regions which are not covered with the hard mask are sequentially etched by, for example, plasma etching. For example, a mixture gas obtaining by mixing HBr gas, $O_2$ gas, Ar gas, and $C_4F_8$ gas is used as the etching gas.

The conductive film 44a and the noble metal film 46a remaining after the etching form lower electrodes 48a. Meanwhile, the conductive oxide film 52, the conductive film 56, the conductive film 58, and the hydrogen barrier film 120 form upper electrodes 60a. Moreover, the lower electrode 48a, the dielectric film 50a, and the upper electrode 60a form ferroelectric capacitors 62a.

Next, the second protection film is removed by dry etching or wet etching. Thereafter, the oxygen barrier film 118, the adhesion film 116, and the underlayer film 114 are etched by, for example, dry etching. At this time, the first protection film is also removed by the etching. For the etching, for example, a down-flow plasma etching apparatus is used, and $CF_4$ gas (5%) and $O_2$ gas (95%) are supplied into the chamber. Moreover, a high-frequency power of, for example, a frequency of 2.45 GHz and 1400 W is supplied to the upper electrode of the plasma etching apparatus, and the substrate temperature is 200° C.

Next, aluminum oxide is deposited on the entire top surface of the semiconductor substrate 10 by, for example, a sputtering method. Thus, a protection film 122 is formed. The protection film 122 is intended to prevent reduction of the dielectric film 50a due to hydrogen or water.

Next, a heat treatment is conducted in an atmosphere containing oxygen at a temperature of 500° C. to 700° C. for 30 minutes to 120 minutes. The heat treatment is intended to recover the damage on the dielectric film 50a due to the sputtering, and thereby to improve the electrical characteristics of the ferroelectric capacitor 62a.

Next, an aluminum oxide film 124 is formed on the protection film 122, and then a heat treatment is conducted in an atmosphere containing oxygen or ozone. Then, a silicone oxide film having a thickness of 1.5 µm is formed on the entire top surface of the semiconductor substrate 10 by, for example, a plasma TEOS CVD method. Thus, an interlayer insulating film 68 is formed.

Thereafter, the surface of the interlayer insulating film 68 is flattened by a CMP method. Then, a heat treatment is conducted in a plasma atmosphere generated by using, for example, $N_2O$ gas or $N_2$ gas at a temperature of 350° C.

Next, a protection film 70 is formed on the interlayer insulating film 68 by, for example, a sputtering method or a CVD method. The protection film 70 is formed of, for example, aluminum oxide, and has a thickness of, for example, 20 nm to 100 nm.

Next, a silicon oxidation film having a thickness of 800 nm to 1 µm is formed on the protection film 70 by, for example, a plasma TEOS CVD method. Thus, an interlayer insulating film 72 is formed. Thereafter, the surface of the interlayer insulating film 72 is polished and flattened by a CMP method.

Next, a contact hole 126a and contact holes 126b are formed by using a photolithography method and an etching method. The contact hole 126a extends from the top surface of the interlayer insulating film 72 to the conductive plug 36. The contact holes 126b extend from the top surface of the interlayer insulating film 72 to their respective upper electrodes 60a. Then, the wall surface of each of the contact holes 126a and 126b is covered with an adhesion layer 128 of TiN or the like. After that, a high-melting-point metal such as W (tungsten) is filled into the contact holes 126a and 126b. Thus, conductive plugs 130a and 130b are formed.

Next, a TiN film 82 having a film thickness of 50 nm, an Al Cu alloy film 84 having a film thickness of 550 nm, a Ti film 86 having a film thickness of 5 nm, and a TiN film 88 having a film thickness of 50 nm are sequentially formed by, for example, a sputtering method. Thereafter, a photolithography process and an etching process are conducted to pattern the TiN film 82, the Al Cu alloy film 84, the Ti film 86, and the TiN film 88. Thus, wirings 90 are formed. A semiconductor device according to the second embodiment is thus completed.

Also in the second embodiment, the conductive oxide film 52 of a dielectric material to which conductivity is provided by adding a metal element is formed on the dielectric film 50a as in the case of the first embodiment. This suppresses the formation of a paraelectric layer at the interface between the upper electrode 60a and the dielectric film 50a. As a result, even when the film thickness of the dielectric film 50a is small, desired characteristics may be obtained. In addition, the semiconductor device may be operated at a lower voltage than conventional ones.

Other Embodiments

In the above description of the first and second embodiments, the cases where TiN films are used as the adhesion layers 78 and 128 are taken as examples. However, the adhesion layers 78 and 128 are not limited to TiN films. For example, a TaN film, a CrN film, a HfN film, a ZrN film, a TiAlN film, a TaAlN film, a TiSiN film, a TaSiN film, a CrAlN film, a HfAlN film, a ZrAlN film, a TiON film, a TaON film, a CrON film, a HfON film, or the like may be used as the adhesion layer 78 or 128.

Moreover, a ZrON film, a TiAlON film, a TaAlON film, a CrAlON film, a HfAlON film, a ZrAlON film, a TiSiON film, a TaSiON film, an Ir film, a Ru film, an IrOx film, a RuOx film, or the like may be used as the adhesion layer 78 or 128.

Moreover, a layered film formed by sequentially stacking a Ti film and a TiN film may be used as the adhesion layer 78 or 128. Still moreover, a layered film formed by sequentially stacking a Ti film and a TaN film may be used as the adhesion layer 78 or 128. Furthermore, a layered film formed by sequentially stacking a Ta film and a TiN film may be used as the adhesion layer 78 or 128. Still furthermore, a layered film formed by sequentially stacking a Ta film and a TaN film may be used as the adhesion layer 78 or 128.

In the above description of the first and second embodiments, the cases where an iridium oxide film is used as the conductive film 56 are taken as examples. However, the conductive film 56 is not limited to the iridium oxide film. For example, a conductive oxide film of an oxide of Ru, Rh, Re, Os, or Pd may be used as a material of the conductive film 56. Moreover, a conductive oxide film of $SrRuO_3$ or the like may be used as a material of the conductive film 56. Furthermore, a layered film of any of these materials may be used as the conductive film 56. Still furthermore, a layered film of any of these conductive oxide films and a noble metal film may be used as the conductive film 56.

In the above description of the first and second embodiments, the cases where an iridium oxide film is used as the conductive film 58 are taken as examples. However, the conductive film 58 is not limited to the iridium oxide film. For example, a conductive oxide film of an oxide of Ru, Rh, Re, Os, or Pd may be used as a material of the conductive film 58. Moreover, a conductive oxide film of $SrRuO_3$ or the like may be used as the material of the conductive film 58. Furthermore, a layered film of any of these materials may be used as the conductive film 58. Still moreover, a layered film of any of these conductive oxide films and a noble metal film may be used as the conductive film 58.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of manufacturing a semiconductor device, the method comprising:
   forming a lower electrode film above a semiconductor substrate;
   forming a dielectric film made of a ferroelectric material on the lower electrode film by a sputtering method;
   subjecting the dielectric film to a crystallization treatment; and
   forming a conductive oxide film on the dielectric film, the conductive oxide film being made of a ferroelectric material to which conductivity is provided by adding a conductive material,
   wherein the ferroelectric material forming the conductive oxide film is PZT, the conductive material is at least one of iridium and ruthenium, and a percentage content of the conductive material in the ferroelectric material forming the conductive oxide film is not less than 1 mol % and not more than 4 mol %, and
   the forming the lower electrode film includes:
   forming a noble metal film made of a noble metal above the semiconductor substrate; and
   forming an amorphous noble metal oxide film, made of an oxide of a noble metal that is the same as the noble metal forming the noble metal film, on the noble metal film, a film thickness of the noble metal oxide film being equal to or more than 0.1 nm and equal to or less than 3 nm.

2. The method of manufacturing a semiconductor device according to claim 1, wherein the ferroelectric material forming the dielectric film is the same as the ferroelectric material forming the conductive oxide film.

3. The method of manufacturing a semiconductor device according to claim 1, wherein a film thickness of the conductive oxide film is not less than 0.1 nm and not more than 50 nm.

4. The method of manufacturing a semiconductor device according to claim 1, further comprising:
   forming a first conductive film made of a conductive oxide on the conductive oxide film; and
   forming a second conductive film made of a conductive oxide on the first conductive film.

5. The method of manufacturing a semiconductor device according to claim 4, further comprising: crystallizing the conductive oxide film between the forming the first conductive film and the forming the second conductive film.

6. The method of manufacturing a semiconductor device according to claim 4, wherein a degree of oxidation of the conductive oxide forming the first conductive film is lower than a degree of oxidation of the conductive oxide forming the second conductive film.

7. The method of manufacturing a semiconductor device according to claim 4, wherein the first conductive film is an iridium oxide film.

8. The method of manufacturing a semiconductor device according to claim 1, wherein
   the conductive oxide film is formed by
      forming an amorphous dielectric film on the dielectric film,
      forming an oxide film containing the conductive material on the amorphous dielectric film, and
      diffusing the conductive material from the oxide film to the amorphous dielectric film.

9. The method of manufacturing a semiconductor device according to claim 8, wherein a temperature during the formation of the oxide film containing the conductive material is 200° C. or above.

10. The method of manufacturing a semiconductor device according to claim 4, further comprising: forming a conductive noble metal film by sputtering a noble metal onto the second conductive film in an Ar atmosphere.

11. The method of manufacturing a semiconductor device according to claim 1, wherein the noble metal film is a platinum film, and the noble metal oxide film is a platinum oxide film.

12. The method of manufacturing a semiconductor device according to claim 1, wherein the conductive oxide film is formed by a sputtering method at a film formation temperature that is equal to or higher than room temperature and equal to or lower than 50° C.

\* \* \* \* \*